(12) United States Patent
Shimoju et al.

(10) Patent No.: US 11,299,653 B2
(45) Date of Patent: Apr. 12, 2022

(54) COMPOSITION, ADHESIVE FILM, LAMINATE, METHOD FOR PRODUCING CURED PRODUCT PATTERN, AND METHOD FOR MANUFACTURING CIRCUIT SUBSTRATE

(71) Applicant: FUJIFILM Corporation, Tokyo (JP)

(72) Inventors: Naoya Shimoju, Haibara-gun (JP); Akinori Shibuya, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 344 days.

(21) Appl. No.: 16/598,546

(22) Filed: Oct. 10, 2019

(65) Prior Publication Data

US 2020/0040222 A1 Feb. 6, 2020

Related U.S. Application Data

(63) Continuation of application No. PCT/JP2018/015057, filed on Apr. 10, 2018.

(30) Foreign Application Priority Data

Apr. 11, 2017 (JP) .............................. JP2017-078234
Jun. 22, 2017 (JP) .............................. JP2017-122255

(51) Int. Cl.
*B32B 7/12* (2006.01)
*C09J 7/30* (2018.01)
(Continued)

(52) U.S. Cl.
CPC .............. *C09J 7/30* (2018.01); *B29C 59/026* (2013.01); *B32B 3/263* (2013.01); *B32B 7/12* (2013.01);
(Continued)

(58) Field of Classification Search
CPC .... C09J 4/00; C09J 2203/326; C09J 2433/00; C09J 4/06; C09J 7/30; C08F 220/1812;
(Continued)

(56) References Cited

U.S. PATENT DOCUMENTS

2009/0155583 A1 6/2009 Xu et al.
2013/0270741 A1 10/2013 Ookawa et al.
(Continued)

FOREIGN PATENT DOCUMENTS

JP 2011-508680 A 3/2011
JP 2012-086484 A 5/2012
(Continued)

OTHER PUBLICATIONS

Office Action dated Sep. 6, 2021 from the Taiwanese Patent Office in Taiwanese Application No. 107112062.
(Continued)

*Primary Examiner* — Lawrence D Ferguson
(74) *Attorney, Agent, or Firm* — Sughrue Mion, PLLC

(57) ABSTRACT

There are provided a composition having excellent adhesiveness and wettability, an adhesive film, a laminate, a method for producing a cured product pattern, and a method for manufacturing a circuit substrate. A composition for forming an adhesive film for imprinting, includes a compound 1 or a compound group 2; and a solvent, in which the compound 1 and the like is a compound decomposable into two or more compounds in a case where a polarity conversion group is treated, and at least one compound has a molecular weight of 30 to 400, and at least one compound has a molecular weight of 1,000 or more, the compound 1: a compound is a resin having a polymerizable group and a polarity conversion group, in which the resin has the polarity conversion group in at least a main chain or a side chain, the polarity conversion group is bonded to the main chain of the
(Continued)

resin via a linking group in a case where the polarity conversion group is provided in the side chain, and the number of atoms constituting a chain of the linking group is 8 or more; and the compound group 2: a compound that has a polymerizable group and does not have a polarity conversion group, and a compound that does not have a polymerizable group and has a polarity conversion group.

16 Claims, 2 Drawing Sheets

(51) Int. Cl.
   B29C 59/02      (2006.01)
   B32B 3/26       (2006.01)
   B32B 37/12      (2006.01)
   B32B 37/15      (2006.01)
   C08F 290/12     (2006.01)
   C09J 4/06       (2006.01)
   C08F 220/28     (2006.01)
   C08F 220/60     (2006.01)
   B29L 31/34      (2006.01)
   H01L 21/027     (2006.01)

(52) U.S. Cl.
   CPC .............. *B32B 37/12* (2013.01); *B32B 37/15* (2013.01); *C08F 220/283* (2020.02); *C08F 220/606* (2020.02); *C08F 290/126* (2013.01); *C09J 4/06* (2013.01); *B29L 2031/34* (2013.01); *B32B 2255/26* (2013.01); *B32B 2305/72* (2013.01); *B32B 2310/0831* (2013.01); *B32B 2457/08* (2013.01); *C09J 2433/00* (2013.01); *H01L 21/027* (2013.01)

(58) Field of Classification Search
   CPC .............. C08F 222/1067; C08F 220/20; C08F 220/283; C08F 220/606; C08F 222/14; C08F 222/20; C08F 230/02; C08F 290/126; C08F 8/00; B29C 59/026; B29L 2031/34; B32B 2255/26; B32B 2305/72; B32B 2310/0831; B32B 2457/08; B32B 37/12; B32B 37/15; B32B 38/06; B32B 3/263; B32B 7/12; G03F 7/0002; G03F 7/027; H01L 21/027
   See application file for complete search history.

(56) References Cited

U.S. PATENT DOCUMENTS

| 2015/0079804 A1 | 3/2015 | Kitagawa et al. |
| 2016/0009946 A1 | 1/2016 | Kitagawa et al. |
| 2018/0002561 A1 | 1/2018 | Oomatsu et al. |

FOREIGN PATENT DOCUMENTS

| JP | 2014-024322 A | 2/2014 |
| JP | 2014-192178 A | 10/2014 |
| JP | 2016-146468 A | 8/2016 |
| TW | 201643223 A | 12/2016 |
| WO | 2016/120944 A1 | 8/2016 |
| WO | 2016/148095 A1 | 9/2016 |

OTHER PUBLICATIONS

Office Action from the Japanese Patent Office dated Jun. 23, 2020 in JP Application No. 2019-512526.
International Search Report dated Jul. 3, 2018 from the International Searching Authority in counterpart International Application No. PCT/JP2018/015057.
International Preliminary Report on Patentability dated Oct. 15, 2019 from the International Bureau in counterpart International Application No. PCT/JP2018/015057.
Written Opinion dated Jul. 3, 2018 from the International Bureau in counterpart International Application No. PCT/JP2018/015057.
Office Action dated Jan. 17, 2022, issued by the Taiwanese Patent Office in Taiwanese application No. 107112062.

COMPOSITION, ADHESIVE FILM, LAMINATE, METHOD FOR PRODUCING CURED PRODUCT PATTERN, AND METHOD FOR MANUFACTURING CIRCUIT SUBSTRATE

CROSS-REFERENCE TO RELATED APPLICATIONS

This application is a Continuation of PCT International Application No. PCT/JP2018/015057 filed on Apr. 10, 2018, which claims priority under 35 U.S.C § 119(a) to Japanese Patent Application No. 2017-078234 filed on Apr. 11, 2017 and Japanese Patent Application No. 2017-122255 filed on Jun. 22, 2017. Each of the above application(s) is hereby expressly incorporated by reference, in its entirety, into the present application.

BACKGROUND OF THE INVENTION

1. Field of the Invention

The present invention relates to a composition, an adhesive film, a laminate, a method for producing a cured product pattern, and a method for manufacturing a circuit substrate. The present invention particularly relates to a composition for forming an adhesive film for imprinting.

2. Description of the Related Art

An imprinting method is technology which is obtained by developing embossing technology well known for manufacturing an optical disk and in which a mold prototype (generally called a mold, a stamper, or a template) on which a concave-convex pattern is formed is pressed against a resist and mechanically deformed, and a fine pattern is precisely transferred. The imprinting method is nano processing technology which is economical since fine structures such as nano structures can be simply repeatedly formed, and in which harmful waste and effluent are little. Therefore, it has recently been expected to be applied to various fields.

In the imprinting method, light is radiated through a light-transmitting mold or a light-transmitting substrate, and a curable composition is photocured, followed by peeling the mold to transfer a fine pattern to a cured product. Since this method enables imprinting at room temperature, it can be applied to a precision processing field of ultrafine patterns such as production of a semiconductor integrated circuit. In recent years, new developments such as a nanocasting method in which advantages of both methods are combined or a reversal imprinting method in which a three-dimensional lamination structure is produced have been reported.

In such an imprint method, a formed pattern is used as a mask and is used for processing a substrate through a method such as etching. This technology can be used for manufacturing high density semiconductor integrated circuit, manufacturing a transistor of a liquid crystal display, processing a magnetic body of a next-generation hard disk called patterned media, and the like through high-accuracy alignment and high integration instead of lithography technology in the related art. Attempts to commercialize the imprinting method relating to these applications have been activated in recent years.

On the other hand, adhesiveness between a substrate and a curable composition for imprinting accompanied by activation of the imprinting method has become a problem. That is, in the imprinting method, a surface of the substrate is coated with the curable composition for imprinting which is then irradiated with light in a state in which the surface thereof is brought into contact with the mold and hardened, and the mold is peeled off. However, in the step of peeling off the mold, the cured product may be peeled off from the substrate and attached to the mold in some cases. It is considered that this is because adhesiveness between the substrate and the cured product is lower than that between the mold and the cured product. It has been studied that an adhesive film for imprinting which improves the adhesiveness between the substrate and the cured product is used (JP2014-024322A and JP2011-508680A) in order to solve such a problem.

SUMMARY OF THE INVENTION

Here, in recent years, not only the adhesiveness between the substrate and the cured product (cured product pattern) but also the filling properties of a curable composition for imprinting to be provided on the surface of an adhesive film for imprinting has been required for the adhesive film.

In particular, in a case where the curable composition for imprinting is applied through an inkjet (IJ) method, and liquid droplets of a curable composition for imprinting 22 are added dropwise onto a surface of an adhesive film 21 at equal intervals as shown in FIG. 2 to be brought into contact with a mold, for example, the above-described liquid droplets spread on the adhesive film 21 to form a film-shaped curable composition for imprinting 22. However, in a case where wettability of the curable composition for imprinting with respect to the adhesive film 21 is low, in some cases, the curable composition for imprinting may not spread on the adhesive film 21 and a portion where the adhesive film 21 is not provided with the curable composition for imprinting 22 may remain. In such a case, filling of the curable composition for imprinting 22 with respect to unevenness of the mold may be insufficient in some cases, and therefore improvement of the wettability of the curable composition for imprinting with respect to the adhesive film 21 is required.

The present invention has been made to solve such problems, and an object of the present invention is to provide a curable composition having excellent adhesiveness and wettability, an adhesive film, a laminate, a method for producing a cured product pattern, and a method for manufacturing a circuit substrate.

Based on the above problems, improving wettability of a curable composition succeeded by using a compound having a polymerizable group and a polarity conversion group and having high wettability of a curable composition, and by converting a polarity of the polarity conversion group through treatment such as heating, and therefore the present invention has been completed. Specifically, the above-described problems have been solved by means <1> and preferably means <2> to <16>.

<1> A composition for forming an adhesive film for imprinting, comprising: at least one of the following compound 1 and the following compound group 2, the compound 1: a compound that has a polymerizable group and a polarity conversion group, and is a resin, in which the resin has the polarity conversion group in at least a main chain or a side chain, the polarity conversion group is bonded to the main chain of the resin via a linking group in a case where the polarity conversion group is provided in the side chain, and the number of atoms constituting a chain of the linking group is 8 or more, and the compound group 2: a compound that has a polymerizable group and does not have a polarity conversion group, and a compound that does not have a polymerizable group and has a polarity conversion group; and a solvent, in which a content of the solvent in the composition is 80 mass % or more, the compound having a polymerizable group and a polarity conversion group, and the compound not having a polymerizable group and having a polarity conversion group each independently are a compound decomposable into two or more compounds in a case where the polarity conversion group is treated, and among the two or more compounds, at least one compound has a molecular weight of 30 to 400, and at least one compound has a molecular weight of 1,000 or more.

<2> The composition according to <1>, in which the treatment is at least one of heating at 100° C. to 250° C., light irradiation, and chemical treatment.

<3> The composition according to <1> or <2>, in which the compound having a molecular weight of 30 to 400 among the generated compounds is selected from alkene, ether, aldehyde, alcohol, carbon dioxide, sulfonic acid, and carboxylic acid.

<4> The composition according to any one of <1> to <3>, comprising at least the compound 1.

<5> The composition according to <4>, comprising the compound that does not have a polymerizable group and has a polarity conversion group.

<6> The composition according to any one of <1> to <5>, in which the compound 1 is a (meth)acrylic resin.

<7> The composition according to any one of <1> to <6>, in which at least one of repeating units having a polarity conversion group constituting the resin that is the compound 1 is a repeating unit derived from a monomer having the polarity conversion group, and a C log P value of the monomer corresponding to a repeating unit obtained after subjecting the repeating unit having the polarity conversion group to the treatment is −10 to 0, provided that the C log P value is a coefficient showing affinity of an organic compound with respect to water and 1-octanol.

<8> The composition according to any one of <1> to <7>, in which the compound 1 further has an alkyleneoxy chain.

<9> The composition according to any one of <1> to <8>, in which a critical surface tension of a film formed of the component excluding the solvent from the composition is 35 mN/m or less, and a critical surface tension after the treatment of a film formed of the component excluding the solvent from the composition is 42 mN/m or more.

<10> An adhesive film formed from the composition according to any one of <1> to <9>.

<11> The adhesive film according to <10>, in which a critical surface tension is 42 mN/m or more.

<12> A laminate comprising: a substrate; and an adhesive film positioned on a surface of the substrate, in which the adhesive film is the adhesive film according to <10> or <11>.

<13> The laminate according to <12>, further comprising a layer formed from a curable composition for imprinting on a surface of the adhesive film.

<14> The laminate according to <12>, further comprising a cured product pattern formed of a curable composition for imprinting on a surface of the adhesive film.

<15> A method for producing a cured product pattern, the method comprising: an adhesive film formation step of forming an adhesive film by applying the composition according to any one of <1> to <9> onto a substrate; an application step of applying a curable composition for imprinting onto a surface of the adhesive film; a mold contact step of bringing the curable composition for imprinting into contact with a mold having a pattern for transferring a pattern shape; a light irradiation step of irradiating the curable composition for imprinting with light to form a cured product; and a release step of separating the cured product and the mold from each other.

<16> A method for manufacturing a circuit substrate, the method comprising a step of obtaining a cured product pattern through the production method according to <15>.

According to the present invention, it has become possible to provide a composition capable of providing an adhesive film having excellent adhesiveness between a substrate and a cured product (cured product pattern) and excellent wettability of a curable composition for imprinting, the adhesive film, a laminate, a method for producing a cured product pattern, and a method for manufacturing a circuit substrate.

DESCRIPTION OF THE PREFERRED EMBODIMENTS

Figure 1:
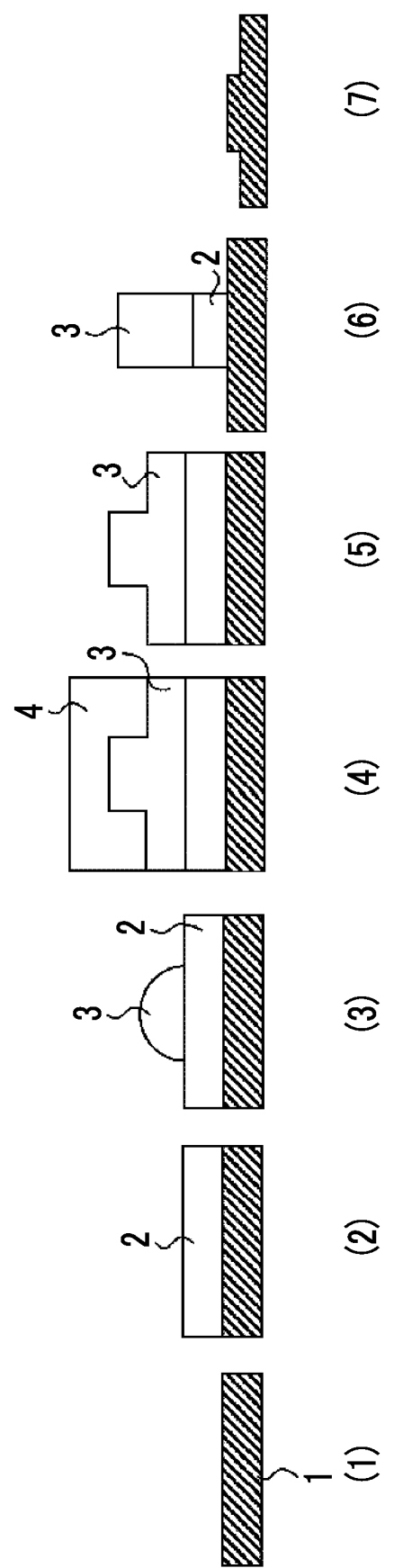
FIG. 1 shows an example of a production process in a case where a cured product pattern is formed and the obtained cured product pattern is used for processing a substrate through etching.

Hereinafter, the contents of the present invention will be described in detail. In the present specification, "to" means a range including numerical values denoted before and after "to" as a lower limit value and an upper limit value.

In the present specification, "(meth)acrylate" represents acrylate and methacrylate.

In the present specification, "imprinting" preferably refers to transferring a pattern with a size of 1 nm to 10 mm, and more preferably to transferring (nanoimprinting) a pattern with a size of about 10 nm to 100 μm.

In the notation of a group (atomic group) in the present specification, in a case where it is not described whether the group is substituted or unsubstituted, the group is meant to include and not to include a substituent. For example, an "alkyl group" includes not only an alkyl group having no substituent (unsubstituted alkyl group), but also an alkyl group having a substituent (substituted alkyl group).

In the present specification, "light" includes not only electromagnetic waves or light with a wavelength in regions such as an ultraviolet region, a near ultraviolet region, a far ultraviolet region, a visible region, or an infrared region, but also radiation. Radiation includes, for example, microwaves, electron beams, extreme ultraviolet rays (EUV), and X-rays. In addition, laser beams such as a 248 nm excimer laser, a 193 nm excimer laser, and a 172 nm excimer laser can also be used. For these light beams, monochromatic light (single-wavelength light) passed through an optical filter may be used, or light with a plurality of different wavelengths (composite light) may be used.

The weight-average molecular weight (Mw) in the present invention is measured through gel permeation chromatography (GPC) unless otherwise specified.

A composition of the embodiment of the present invention is a composition for forming an adhesive film for imprinting, which includes at least one of the following compound 1 and the following compound group 2; and a solvent, in which a content of the solvent in the composition is 80 mass % or more, the compound having the polymerizable group and the polarity conversion group, and the compound not having the polymerizable group and having the polarity conversion group each independently are a compound decomposable into two or more compounds in a case where the polarity conversion group is treated, and among the two or more compounds, at least one compound has a molecular weight of 30 to 400, and at least one compound has a molecular weight of 1,000 or more.

The compound 1: a compound that has a polymerizable group and a polarity conversion group, and is a resin, in which the resin has the polarity conversion group in at least a main chain or a side chain, the polarity conversion group is bonded to the main chain of the resin via a linking group in a case where the polarity conversion group is provided in the side chain, and the number of atoms constituting a chain of the linking group is 8 or more.

The compound group 2: a compound that has a polymerizable group and does not have a polarity conversion group, and a compound that does not have a polymerizable group and has a polarity conversion group.

As mentioned above, the compound having the polymerizable group and the polarity conversion group, and the compound not having the polymerizable group and having the polarity conversion group each independently are the compound decomposable into two or more compounds in a case where the polarity conversion group is treated, and among the two or more compounds, at least one compound has a molecular weight of 30 to 400, and at least one compound has a molecular weight of 1,000 or more. By using this compound, wettability with respect to a substrate can be increased in a state before polarity conversion, and adhesiveness to the curable composition for imprinting can be increased in a state after the polarity conversion. When a hydrophilic resin is used for the adhesive film, the wettability with respect to the substrate is improved as compared with a case where a hydrophobic resin is used. However, because hydrophilic groups of hydrophilic resins generally have high surface free energy and are not easily distributed on surfaces, there are cases where a sufficient effect of the hydrophilic groups cannot be obtained on the surface of the adhesive film. In the present invention, such a problem can be effectively avoided by converting a polarity after forming a composition into a film shape.

<Compound 1>

The compound 1 used in the present invention is a compound that has a polymerizable group and a polarity conversion group, and is a resin, in which the resin has the polarity conversion group in at least a main chain or a side chain, the polarity conversion group is bonded to the main chain of the resin via a linking group in a case where the polarity conversion group is provided in the side chain, and the number of atoms constituting a chain of the linking group is 8 or more.

The "polymerizable group" is a group that undergoes radical polymerization or ionic polymerization. Examples of radical polymerization include methods using a compound that generates radicals by heat or light, or oxidation-reduction. In a case of ionic polymerization, examples of anionic polymerization include methods using a nucleophile such as n-butyllithium, and examples of cationic polymerization include methods using an electrophile such as a protonic acid, a Lewis acid, a halogen atom, or a carbocation.

An example of the polymerizable group in the compound 1 includes an ethylenically unsaturated group, an epoxy group, and an oxetanyl group, and an ethylenically unsaturated group is preferable. Specific examples of the ethylenically unsaturated group include a (meth)acrylic group ((meth)acryloyloxy group and (meth)acryloylamino group), a maleimide group, an allyl group, a vinyl ether group, and a vinyl group, and a (meth)acrylic group is preferable and a (meth)acryloyloxy group is more preferable.

The polarity conversion group in the present invention refers to a group that converts a polarity of a compound by treatment. Examples thereof include an ester group, a sulfonic acid ester group, an acetal group, a carbonate group, an ether group, and a silyl ether group. An ester group, a sulfonic acid ester group, an acetal group, and a silyl ether group are preferable, and an ester group and a sulfonic acid ester group are more preferable.

The treatment in the present invention means that a chemical action is applied to the polarity conversion group by means such as heating, light irradiation, and chemical treatment, in a state where the composition of the embodiment of the present invention is formed into a film shape, or after the composition of the embodiment of the present invention is formed into a film shape and the solvent is volatilized. By this treatment, the polarity conversion group in the film is decomposed to generate the compound having the predetermined molecular weight. As a result, a polarity of the film is different from a polarity of the film in the state of the composition before treatment. Accordingly, it becomes possible to improve the wettability of the curable composition for imprinting with respect to the adhesive film.

Specific examples of treatment in the compound 1 include at least one of heating at 100° C. to 250° C., light irradiation, and chemical treatment. Examples thereof further include treatment of denaturing a surface of the film by bringing the film into contact with an acidic solution, a basic solution, and the like.

Heating is preferably performed at 100° C. to 250° C., and is more preferably performed at 150° C. to 250° C. A heating time is preferably 0.1 to 10 minutes, and is more preferably 0.1 to 3 minutes.

Irradiation light is preferably near ultraviolet light, far ultraviolet light, visible light, infrared light, electromagnetic wave, or radiation, and is more preferably near ultraviolet light, far ultraviolet light, or radiation. A wavelength is preferably 13 to 436 nm, and is more preferably 157 to 436 nm.

In a case of light irradiation, an embodiment using an acid generator or an acid proliferation agent is exemplified. Each of the acid generator and the acid proliferation agent may be used alone or may be used in combination of two or more kinds thereof.

Examples of acid generators include acid generators disclosed in JP5687442B and JP6037994B, in addition to an acid generator used in the examples, and the contents thereof are incorporated herein.

The acid generator may also be a resin containing a repeating unit having a group that generates an acid upon irradiation with light (a photoacid generating group).

Examples of such repeating units include a repeating unit represented by Formula (4A).

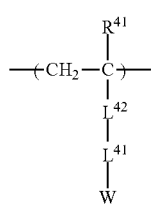

(4A)

$R^{41}$ represents a hydrogen atom or a methyl group. $L^{41}$ represents a single bond or a divalent linking group. $L^{42}$ represents a divalent linking group. W represents a structural site that decomposes upon irradiation with actinic rays or radiation to generate an acid in a side chain.

Specific examples of the repeating unit represented by Formula (4A) are shown below, but the present invention is not limited thereto.

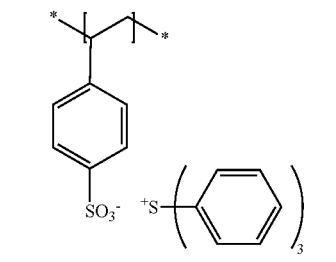

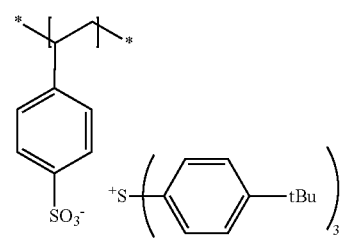

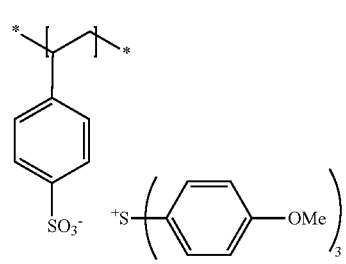

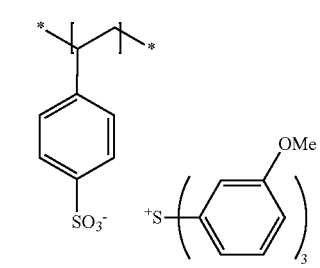

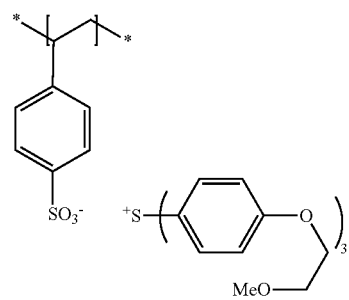

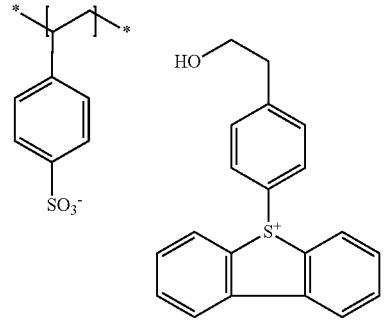

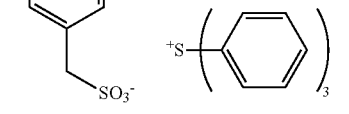

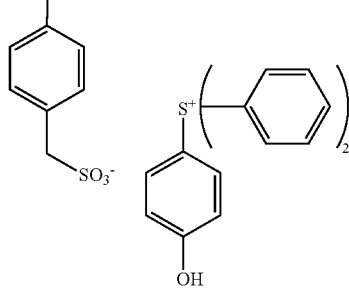

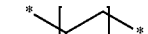

-continued

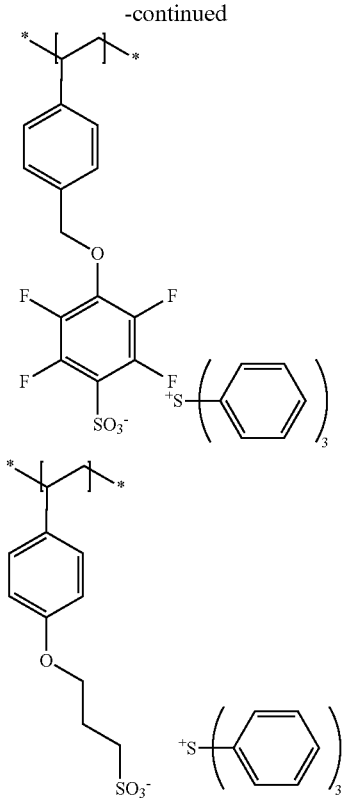

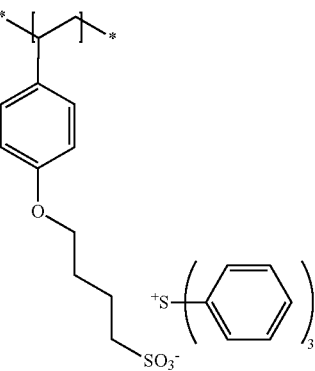

-continued

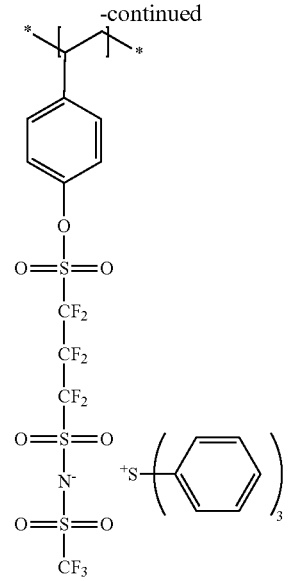

In addition, examples of the repeating unit represented by Formula (4A) include repeating units described in paragraphs [0094] to [0105] of JP2014-041327A.

In the resin containing a repeating unit having a photoacid generating group, a content of the repeating unit having a photoacid generating group is preferably 1 to 40 mol %, is more preferably 5 to 35 mol %, and is even more preferably 5 to 30 mol % with respect to all repeating units in the resin.

Examples of acid proliferation agents include, in addition to an acid proliferation agent used in the examples, acid proliferation agents disclosed in JP2014-047329A, WO95/029968A, WO98/024000A, JP1996-305262A (JP-H08-305262A), JP1997-034106A (JP-H09-034106A), JP1996-248561A (JP-H08-248561A), JP1996-503082A (JP-H08-503082A), U.S. Pat. No. 5,445,917A, JP1996-503081A (JP-H08-503081A), U.S. Pat. Nos. 5,534,393, 5,395,736, 5,741,630A, 5,334,489, 5,582,956, 5,578,424, 5,453,345, 5,445,917A, EP665960B, EP757628B, EP665961B, U.S. Pat. No. 5,667,943A, JP1998-001508A (JP-H10-001508A), JP1998-282642A (JP-H10-282642A), JP1997-512498A (JP-H09-512498A), JP2000-062337A, JP2005-017730A, and the like, the contents of which are incorporated herein.

Specifically, compounds represented by Formulas (1) to (6) are preferable.

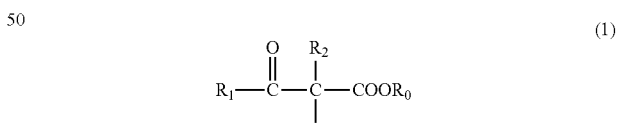

(1)

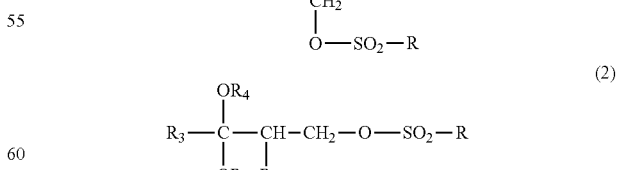

(2)

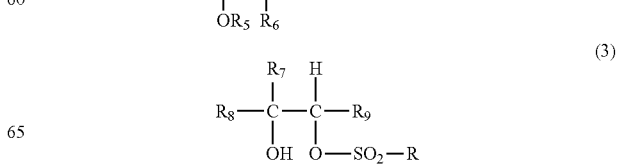

(3)

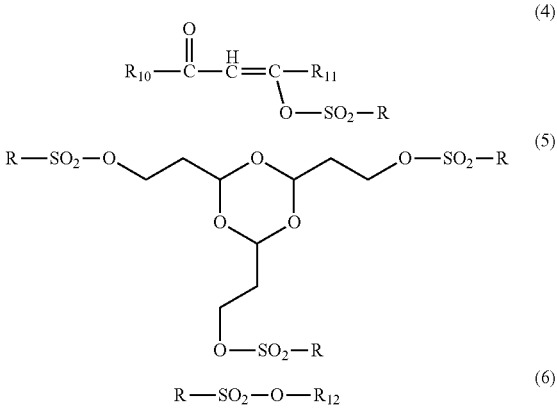

In Formulas (1) to (6), R represents an alkyl group, a cycloalkyl group, an aryl group, or an aralkyl group.

$R_0$ represents a group capable of leaving by the action of an acid.

$R_1$ represents an alkyl group, a cycloalkyl group, an aryl group, an aralkyl group, an alkoxy group, or an aryloxy group.

$R_2$ represents an alkyl group or an aralkyl group.

$R_3$ represents an alkyl group, a cycloalkyl group, an aryl group, or an aralkyl group.

$R_4$ and $R_5$ each independently represent an alkyl group, and $R_4$ and $R_5$ may be bonded to each other to form a ring.

$R_6$ represents a hydrogen atom or an alkyl group.

$R_7$ represents a hydrogen atom, an alkyl group, a cycloalkyl group, an aryl group, or an aralkyl group.

$R_8$ represents an alkyl group, a cycloalkyl group, an aryl group or, an aralkyl group.

$R_9$ represents a hydrogen atom, an alkyl group, a cycloalkyl group, an aryl group, or an aralkyl group.

$R_9$ may be bonded to $R_7$ to form a ring.

$R_{10}$ represents an alkyl group, a cycloalkyl group, an alkoxy group, an aryl group, an aralkyl group, an aryloxy group, or an alkenyloxy group.

$R_{11}$ represents an alkyl group, a cycloalkyl group, an alkoxy group, an aryl group, an aralkyl group, an aryloxy group, or an alkenyl group.

$R_{10}$ and $R_{11}$ may be bonded to each other to form a ring.

$R_{12}$ represents an alkyl group, a cycloalkyl group, an aryl group, an alkenyl group, an alkenyl group, or a cyclic imide group.

In the present invention, the polarity conversion group is preferably decomposed into a carboxylic acid or an alcohol.

In the compound 1, the polarity conversion group is treated and decomposed, and among the generated compounds, at least one compound has a molecular weight of 30 to 400, preferably has a molecular weight of 30 to 350, more preferably has a molecular weight of 30 to 300, and even more preferably has a molecular weight of 30 to 250.

Among the generated compounds, the compound having a molecular weight of 30 to 400 is preferably selected from alkene, ether, aldehyde, alcohol, carbon dioxide, sulfonic acid, and carboxylic acid, and is more preferably selected from alkene, ether, aldehyde, and alcohol.

In the compound 1, the polarity conversion group is treated and decomposed, and among the generated compounds, at least one compound has a molecular weight of 1,000 or more. Such a compound is generally a constituent material of the adhesive film. A molecular weight of the compound is preferably 1,100 or more, is more preferably 2,000 or more, is even more preferably 3,000 or more, is still even more preferably 4,500 or more; and is preferably 200,000 or less, is more preferably 180,000 or less, and is even more preferably 100,000 or less. A molecular weight of the compound 1 is a weight-average molecular weight.

The compound 1 preferably has an alkyleneoxy chain. An alkylene chain forming the alkyleneoxy chain is preferably a linear or branched alkylene chain, and is more preferably a linear alkylene chain. The alkylene chain may or may not have a substituent, but preferably has no substituent. The alkylene chain is also preferably an alkylene chain having 1 to 6 carbon atoms, more preferably a methylene chain, an ethylene chain, or a propylene chain, and still more preferably an ethylene chain.

The compound 1 may have a repeating structure of an alkyleneoxy chain.

The number n (corresponding to, for example, n of a resin A-1 in Examples to be described later) of repeating units of (-alkylene chain-oxygen atom-) in one molecule of the compound 1 is preferably 2 to 500, is more preferably 2 to 300, is even more preferably 2 to 100, is still even more preferably 8 to 90, and is still even more preferably 13 to 90.

The compound 1 is more preferably a (meth)acrylic resin.

In the present invention, the compound 1 is preferably a resin having the polarity conversion group in the main chain, or a resin having the polarity conversion group in the side chain. In addition, in a case where the compound 1 is the resin having the polarity conversion group in the side chain, the polarity conversion group is bonded to the main chain of the resin via a linking group, and the number of atoms constituting the chain of the linking group is 8 or more, and is preferably 23 or more. The upper limit of the number of atoms constituting the chain of the linking group is not particularly defined, and may be, for example, 500 or less, 300 or less, or 90 or less. In a case where the compound 1 is the resin having the polarity conversion group in the main chain, mobility increases due to the main chain being cut along with polarity conversion, and wettability and gas permeability are improved. Furthermore, in a case where the compound 1 is the resin having the polarity conversion group in the side chain, the number of atoms constituting the chain of the linking group is 8 or more, and thereby effects of weakening intermolecular force, lowering a glass transition temperature of a film, and increasing a free volume is obtained. In a case where atmosphere during pattern formation contains a gas that permeates a substrate, the adhesive film has gas permeability because of an increase in free volume, and therefore a gas in a gas region surrounded by the curable composition for imprinting is discharged from the substrate side.

Regarding atoms constituting the chain of the linking group, for example, in a case where the linking group is —$CH_2CH_2O$—, the atoms constituting the chain are a carbon atom, a carbon atom, and an oxygen atom in this order, and the number of atoms constituting the chain is 3. The same applies to other linking groups.

In the present invention, at least one of repeating units having the polarity conversion group constituting the resin that is the compound 1 is a repeating unit derived from a monomer having the polarity conversion group, and a C log P value of the monomer corresponding to a repeating unit obtained after subjecting the repeating unit having the polarity conversion group to the treatment (that is, a raw material monomer of a resin obtained after treating the polarity conversion group) is preferably −10 to 0, is more preferably −10 to −0.2, is even more preferably −10 to −1, and is still even more preferably −10 to −2. The C log P value is a coefficient showing affinity of an organic compound with respect to water and 1-octanol, and is calculated according to a method described in Examples to be described later.

Furthermore, the compound 1 preferably contains one kind or two or more kinds of a repeating unit represented by Formula (1-I), and a repeating unit represented by Formula (1-II).

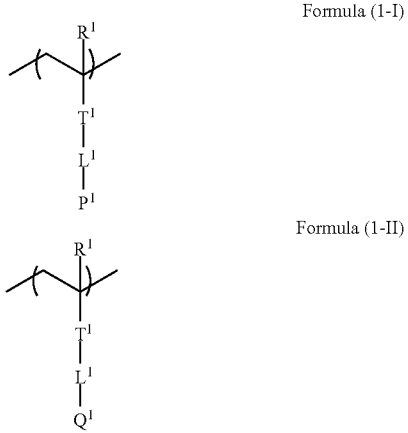

Formula (1-I)

Formula (1-II)

In Formulas (1-I) and (1-II), $R^1$'s each independently represent a hydrogen atom, a methyl group, a hydroxymethyl group, a halogen atom, or a hydrocarbon group having 1 to 6 carbon atoms. In a case where $R^1$ is a hydrocarbon group, hydrogen atoms of $R^1$'s each independently may be substituted by a halogen atom or a hydroxyl group. $T^1$'s each independently represent a single bond, *—O—, *—C(=O)O—, or *—C(=O)NH—, and is bonded to the main chain on the * side. $P^1$'s each independently represent a polymerizable group, and $Q^1$ is a polarity conversion group.

$L^1$ in Formula (1-I) represents a single bond or a divalent linking group, and $L^1$ in Formula (1-II) represents a linking group having 8 or more atoms constituting a chain of the linking group.

$R^1$ is preferably a hydrogen atom or a methyl group.

$T^1$ is preferably a single bond, is preferably *—C(=O)O— or *—C(=O)NH—, is more preferably *—C(=O)O— or *—C(=O)NH—, and is even more preferably *—C(=O)O—.

$L^1$ in Formula (1-I) represents a single bond or a divalent linking group, is preferably a divalent linking group. The number of atoms constituting a chain of the divalent linking group is more preferably 2 or more, and is even more preferably 23 or more. The upper limit of the number of atoms constituting the chain of the linking group is not particularly defined, and may be, for example, 500 or less, 300 or less, or 90 or less.

$L^1$ in Formula (1-II) is a linking group having 8 or more atoms constituting the chain of the linking group, and the number of atoms is more preferably 23 or more. The upper limit of the number of atoms constituting the chain of the linking group is not particularly defined, and may be, for example, 500 or less, 300 or less, or 90 or less.

A first embodiment of $L^1$ is a divalent linking group containing an -alkylene chain-oxygen atom-structure.

The alkylene chain is preferably a linear or branched alkylene chain and is more preferably a linear alkylene chain. The alkylene chain may or may not have a substituent, but preferably has no substituent. The alkylene chain is also preferably an alkylene chain having 1 to 6 carbon atoms, more preferably a methylene chain, an ethylene chain, or a propylene chain, and still more preferably an ethylene chain.

In the present invention, the number n (for example, corresponding to n of a resin A-1 in Examples to be described below) of repeating units consisting of an -alkylene group-oxygen atom-structure is preferably 2 to 500, is more preferably 2 to 100, is even more preferably 8 to 90, and is still even more preferably 13 to 90.

A second embodiment of $L^1$ is a divalent linking group having at least one of an anion structure and a cation structure.

Examples of the anion structure include sulfonate ion, phosphonate ion (for example, —O—P(=O)(—O⁻)O—), carboxylate ion, and halogen ion, and sulfonate ion, phosphonate ion, and carboxylate ion are preferable. In addition, a quaternary ammonium ion is preferable as a cation structure.

It is preferable that the above-described anion structure and cation structure are bonded to each other through an alkylene chain. Specifically the alkylene chain is preferably a linear or branched alkylene chain and more preferably a linear alkylene chain. The number of carbon atoms constituting an alkylene chain is preferably 2 to 8, more preferably 2 to 6, and still more preferably 2 to 4. The alkylene chain may or may not have a substituent, but preferably has no substituent.

Specific examples of forms in which the above-described anion structure and the cation structure are bonded to each other through an alkylene chain include aspects of -anion structure-alkylene chain-cation structure (terminal side) and -anion structure-alkylene chain-cation structure (terminal side).

In addition, only one of the anion structure and the cation structure may be included, and the other may be ionically bonded as a counter cation or a counter anion of a repeating unit.

A third embodiment of $L^1$ is a divalent linking group having an amine structure. The amine here is preferably a secondary amine, a tertiary amine, or a quaternary ammonium ion. Specific examples of the amine structure include the following groups.

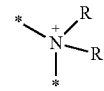

In the above, * is a binding position with another moiety. R's each independently represent a hydrogen atom, a methyl group, and an ethyl group, and a methyl group is preferable.

A fourth embodiment of $L^1$ is a divalent linking group containing a hydroxyl group. The divalent linking group preferably has an alkylene chain, and preferably has a structure in which one or more hydrogen atoms of the alkylene chain are substituted by a hydroxyl group. In addition, in the alkylene chain, it is more preferable that 1 to 3 hydrogen atoms be substituted by a hydroxyl group. The number of carbon atoms constituting an alkylene group is preferably 2 to 5 and is more preferably 2 and 3.

$P^1$ represents a polymerizable group, and a preferred range of the polymerizable group is the same as that of the polymerizable group described above.

$Q^1$ represents a polarity conversion group, and a preferred range of the polarity conversion group is the same as that of the polarity conversion group described above.

A first embodiment in a case where the compound 1 is a resin is a resin containing a repeating unit represented by Formula (1-I) and a repeating unit represented by Formula (1-II). In the first embodiment, a total of the repeating unit represented by Formula (1-I) and the repeating unit represented by Formula (1-II) preferably accounts for greater than or equal to 90 mol % of all repeating units. In the first embodiment, a molar ratio of the repeating unit represented by Formula (1-I) to the repeating unit represented by Formula (1-II) is preferably 1 to 99:99 to 1, is more preferably 10 to 90:90 to 10, and is even more preferably 20 to 80:80 to 20.

A second embodiment in a case where the compound 1 is a resin is a resin in which a total of the repeating unit represented by Formula (1-I), the repeating unit represented by Formula (1-II), and repeating units other than these repeating units account for 90 mol % or more of the all repeating units. Examples of other repeating units include a repeating unit represented by Formula (2-II) to be described later. A ratio in this case is preferably 1 to 99:99 to 1:99 to 1, is more preferably 10 to 90:90 to 10:90 to 10, and is even more preferably 20 to 80:80 to 20:80 to 20.

In the first and second embodiments, the repeating unit represented by Formula (1-I), the repeating unit represented by Formula (1-II), and other repeating units such as the repeating unit represented by Formula (2-II) each may be one kind or two or more kinds.

Specific examples of resins as the compound 1 include resins A-1 to A-16, A-19, and A-22 used in Examples to be described later.

A content of the compound 1 contained in the composition of the embodiment of the present invention in a solid content contained in the above-described composition is preferably greater than or equal to 30 mass %, more preferably greater than or equal to 50 mass %, still more preferably greater than or equal to 70 mass %, and still more preferably greater than or equal to 89 mass %. The content of the above-described compound 1 in the solid content contained in the above-described composition is less than or equal to 100 mass %.

The compound 1 contained in the composition may be used alone or in combination of two or more thereof. In a case where the composition for forming an adhesive layer contains two or more kinds thereof, the total amount is preferably within the above-described ranges.

<<Compound Group 2>>

The compound group 2 in the present invention includes a compound that has a polymerizable group and does not have a polarity conversion group (hereinafter, will be referred to as the "compound 2A"), and a compound that does not have a polymerizable group and has a polarity conversion group (hereinafter, will be referred to as the "compound 2B").

The detailed descriptions of the polymerizable group and the polarity conversion group are the same as those of the polymerizable group and the polarity conversion group described in the description of the compound 1, and a preferred range thereof is also the same.

The compound (the compound 2A) having a polymerizable group and not having a polarity conversion group is preferably a resin, and is more preferably a (meth)acrylic resin.

In addition, the compound having a polymerizable group and not having a polarity conversion group is preferably a resin having a polymerizable group in the side chain. The resin that is the compound 2A may further contain other repeating units not having a polymerizable group and a polarity conversion group.

Furthermore, the resin that is the compound 2A preferably contains one kind or two or more kinds of a repeating unit represented by Formula (2-I), and a repeating unit represented by Formula (2-II).

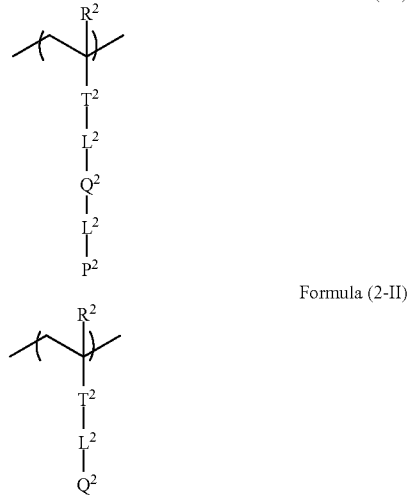

Formula (2-I)

Formula (2-II)

In Formulas (2-I) and (2-II), $R^2$'s each independently represent a hydrogen atom, a methyl group, a hydroxymethyl group, a halogen atom, or a hydrocarbon group having 1 to 6 carbon atoms. In a case where $R^2$ is a hydrocarbon group, hydrogen atoms of $R^2$'s each independently may be substituted by a halogen atom or a hydroxyl group. $T^2$'s each independently represent a single bond, *—O—, *—C(=O)O—, or *—C(=O)NH—, and is bonded to the main chain on the * side. $L^2$'s each independently represent a single bond or a divalent linking group. $P^2$'s each independently represent a polymerizable group. $Q^2$ is a divalent linking group or a monovalent linking group.

$R^2$ is preferably a hydrogen atom or a methyl group.

$T^2$ is preferably a single bond, is preferably *—C(=O)O— or *—C(=O)NH—, is more preferably *—C(=O)O— or *—C(=O)NH—, and is even more preferably *—C(=O)O—.

$L^2$ represents a single bond or a divalent linking group. A single bond, a substituted or unsubstituted hydrocarbon group (an alkylene group and an arylene group are preferable), —NH—, C(=O)—, —O—, —S—, —C(=O)O—, —C(=O)NH—, or a combination thereof is preferable and a single bond, an alkylene group, and an alkylene group having a hydroxyl group as a substituent are more preferable. The number of carbon atoms constituting an alkylene group is preferably 1 to 5 and more preferably 2 to 4. In addition, the alkylene group is preferably a linear alkylene group.

$P^2$ represents a polymerizable group, and a preferred range thereof is the same as that of the polymerizable group in the compound 1 described above.

$Q^2$ in a first embodiment is a monovalent substituent or a divalent linking group which has an -alkylene chain-oxygen atom-structure.

The alkylene chain is preferably a linear or branched alkylene chain and is more preferably a linear alkylene chain. The alkylene chain may or may not have a substituent, but preferably has no substituent. The alkylene chain is also preferably an alkylene chain having 1 to 6 carbon atoms, more preferably a methylene chain, an ethylene chain, or a propylene chain, and still more preferably an ethylene chain.

The number n (for example, corresponding to n of a resin A-1 in Examples to be described below) of repeating units consisting of an -alkylene group-oxygen atom-structure is preferably 2 to 500, is more preferably 2 to 300, is even more preferably 8 to 90, and is still even more preferably 13 to 90.

In a case where $Q^2$ is positioned at a terminal of a side chain of a resin, that is, in a case where $Q^2$ is a monovalent linking group, $Q^2$ is preferably represented by -(alkylene chain-oxygen atom)$_n$-hydrogen atom (terminal side).

$Q^2$ in a second embodiment is a monovalent linking group or a divalent linking group which has at least one of an anion structure and a cation structure.

Examples of the anion structure include sulfonate ion, phosphonate ion (for example, —O—P(=O)(—O$^-$)O—), carboxylate ion, and halogen ion, and sulfonate ion, phosphonate ion, and carboxylate ion are preferable. In addition, a quaternary ammonium ion is preferable as a cation structure.

It is preferable that the above-described anion structure and cation structure are bonded to each other through an alkylene chain. Specifically the alkylene chain is preferably a linear or branched alkylene chain and more preferably a linear alkylene chain. The number of carbon atoms constituting an alkylene chain is preferably 2 to 8, more preferably 2 to 6, and still more preferably 2 to 4. The alkylene chain may or may not have a substituent, but preferably has no substituent.

Specific examples of forms in which the above-described anion structure and the cation structure are bonded to each other through an alkylene chain include aspects of -anion structure-alkylene chain-cation structure (terminal side) and -anion structure-alkylene chain-cation structure (terminal side).

In addition, only one of the anion structure and the cation structure may be included, and the other may be ionically bonded as a counter cation or a counter anion of a repeating unit.

$Q^2$ in a third embodiment is a monovalent substituent or a divalent linking group which has an amine structure. The amine here is preferably a secondary amine, a tertiary amine, or a quaternary ammonium ion. Specific examples of the amine structure include the following groups.

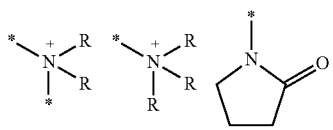

In the above, * is a binding position with another moiety. R's each independently represent a hydrogen atom, a methyl group, and an ethyl group, and a methyl group is preferable.

$Q^2$ in a fourth embodiment is a monovalent substituent or a divalent linking group which contains a hydroxyl group. $Q^2$ has an alkylene chain, and preferably has a structure in which one or more hydrogen atoms of the alkylene chain are substituted by a hydroxyl group. In addition, in the alkylene chain, it is more preferable that 1 to 3 hydrogen atoms be substituted by a hydroxyl group. The number of carbon atoms constituting an alkylene chain is preferably 1 to 5 and more preferably 2 to 4.

A first embodiment in a case where the compound 2A is a resin is a resin containing a repeating unit represented by Formula (2-I) and a repeating unit represented by Formula (2-II). In the first embodiment, a total of the repeating unit represented by Formula (2-I) and the repeating unit represented by Formula (2-II) preferably accounts for greater than or equal to 90 mol % of all repeating units. In the first embodiment, a molar ratio of the repeating unit represented by Formula (2-I) to the repeating unit represented by Formula (2-II) is preferably 1 to 99:99 to 1:99 to 1, is more preferably 10 to 90:90 to 10, and is even more preferably 20 to 80:80 to 20.

A second embodiment in a case where the compound 2A is a resin is a resin in which the repeating unit represented by Formula (2-I) accounts for 90 mol % or more of the all repeating units.

In the first and second embodiments, the repeating units represented by Formulae (2-I) to (2-II) each may be only one kind or two or more kinds thereof.

Specific examples of resins as the compound 2A include resins A-17 and A-18 used in Examples to be described later. In addition, specific examples of the compound 2A include additives B-7 and B-8 used in Examples to be described later.

A weight-average molecular weight of the resin as the compound 2A is preferably 1,000 or more, is more preferably 2,000 or more, is even more preferably 3,000 or more, and is still even more preferably 4,500 or more. In addition, a weight-average molecular weight of the resin as the compound 2A is preferably 200,000 or less, is more preferably 180,000 or less, and is even more preferably 100,000 or less.

A content of the compound 2A contained in the composition of the embodiment of the present invention in a solid content contained in the above-described composition is preferably 30 mass % or more, is more preferably 50 mass % or more, is even more preferably 70 mass % or more, is still even more preferably 80 mass % or more, is further still even more preferably 85 mass % or more, and is further still even more preferably 89 mass % or more. A content of the resin as the compound 2A is 99.9 mass % or less in a solid content contained in the composition.

The compound 2A contained in the composition may be used alone or in combination of two or more thereof. In a case where the composition for forming an adhesive layer contains two or more kinds thereof, the total amount is preferably within the above-described ranges.

The compound group 2 in the present invention includes the compound (the compound 2B) having a polarity conversion group. The compound 2B preferably contains 1 to 3 polarity conversion groups in one molecule, more preferably contains 1 or 2 polarity conversion groups, and even more preferably contains 1 polarity conversion group.

In a case where the compound 2B is a polymer, a weight-average molecular weight is 1,000 or more, and is preferably 2,000 or more, and is preferably 100,000 or less, is more preferably 50,000 or less, and is even more preferably 30,000 or less.

The compound 2B preferably has an alkyleneoxy chain. An alkylene chain forming the alkyleneoxy chain is preferably a linear or branched alkylene chain, and is more preferably a linear alkylene chain. The alkylene chain may or may not have a substituent, but preferably has no substituent. The alkylene chain is also preferably an alkylene chain having 1 to 6 carbon atoms, more preferably a methylene chain, an ethylene chain, or a propylene chain, and still more preferably an ethylene chain.

The number n (corresponding to, for example, n of a resin A-1 in Examples to be described later) of repeating units of (-alkylene chain-oxygen atom-) in one molecule of the compound 2B is preferably 2 or more, is more preferably 8 or more, is even more preferably 13 or more, and is still even more preferably 20 or more, and is preferably 500 or less, is more preferably 300 or less, and is even more preferably 90 or less.

A content of the compound 2B contained in the composition of the embodiment of the present invention in a solid content contained in the above-described composition is preferably 70 mass % or less, is more preferably 50 mass % or less, is even more preferably 30 mass % or less, is still even more preferably 20 mass % or less, is further still even more preferably 15 mass % or less, and is further still even more preferably 11 mass % or less. The lower limit of a content of the compound 2B is 0.1 mass % or more in a solid content contained in the composition. The compound 2B contained in the composition may be used alone or in combination of two or more thereof. In a case where the composition for forming an adhesive layer contains two or more kinds thereof, the total amount is preferably within the above-described ranges.

<Blend Form of Compound 1 and Compound Group 2>

The composition of the embodiment of the present invention may contain only the compound 1 (the compound having a polymerizable group and a polarity conversion group), may contain only the compound group 2 (the compound having a polymerizable group and not having a polarity conversion group and the compound not having a polymerizable group and having a polarity conversion group), or may contain both compound 1 and compound group 2.

In addition, an embodiment in which the composition contains the compound 1 and further contains the compound not having a polymerizable group and having a polarity conversion group is also preferred. The compound not having a polymerizable group and having a polarity conversion group has the same meaning as the compound 2B described in the compound group 2, and a preferred range thereof is also the same.

In the composition of the embodiment of the present invention, a total of the compounds belonging to the compound 1 and the compound group 2 preferably accounts for 70 mass % or more, more preferably accounts for 80 mass % or more, even more preferably accounts for 90 mass % or more, and still even more preferably accounts for 95 mass % or more of a solid content of the composition. The upper limit thereof may be 100 mass %.

In the composition of the embodiment of the present invention, each of the compound 1 (the compound having a polymerizable group and a polarity converting group) and the compound (the compound 2A) having a polymerizable group and not having a polarity converting group is preferably a resin.

The composition of the embodiment of the present invention preferably contains, in a solid content of the composition, 50 mass % or more, more preferably contains 60 mass % or more, even more preferably contains 70 mass % or more, still even more preferably contains 80 mass % or more, further still even more preferably contains 90 mass % or more, and further still even more preferably contains 95 mass % or more of the compound (the compound 1) having a polymerizable group and a polarity conversion group and the compound (the compound 2A) having a polymerizable group and not having a polarity conversion group as the resin.

Examples of preferred blend forms of the compound 1 and the compound group 2 of the present invention include the following forms.

(1) A form in which 80 mass % or more of a solid content in the composition is the compound 1 (preferably a resin) having the polymerizable group and the polarity conversion group (preferably 85 mass % or more, more preferably 90 mass % or more, even more preferably 95 mass % or more, and still even more preferably 98 mass % or more).

(2) A form in which 70 mass % or more of a solid content in the composition is the compound 2A (preferably a resin) (preferably 80 mass % or more, more preferably 85 mass % or more, even more preferably 89 mass % or more, and still even more preferably 99.9 mass % or less), and in which 30 mass % or less of a solid content in the composition is the compound 2B (preferably 20 mass % or less, more preferably 15 mass % or less, even more preferably 11 mass % or less, and still even more preferably 0.1 mass % or more).

(3) A form in which 70 mass % or more of a solid content in the composition is the compound 1 (preferably a resin) (preferably 80 mass % or more, more preferably 85 mass % or more, even more preferably 89 mass % or more, and still even more preferably 99.9 mass % or less), and in which 30 mass % or less of a solid content in the composition is the compound 2B (preferably 20 mass % or less, more preferably 15 mass % or less, even more preferably 11 mass % or less, and still even more preferably 0.1 mass % or more).

<Other Compounds Having Polarity Conversion Group>

The composition of the embodiment of the present invention may contain a compound having a polarity conversion group other than the above-mentioned compound 1 and compound group 2, in addition to the compound 1 and the compound group 2.

Specific examples thereof include a compound that has a polymerizable group and a polarity conversion group, and is a resin, in which the polarity conversion group is bonded to the main chain of the resin via a linking group, and the number of atoms constituting the chain of the linking group is less than 8. In addition, low molecular weight compounds such as an additive B-6 used in Examples to be described later are also exemplified.

<Solvent>

The composition of the embodiment of the present invention contains a solvent. The solvent is preferably an organic solvent. The solvent is preferably a solvent having any one or more of an ester group, a carbonyl group, a hydroxyl group, or an ether group.

As specific examples of the solvent, propylene glycol monoalkyl ether carboxylate, propylene glycol monoalkyl ether, lactate, acetate, alkoxypropionic acid ester, linear ketone, cyclic ketone, lactone, and alkylene carbonate are selected.

As propylene glycol monoalkyl ether carboxylate, at least one selected from the group consisting of propylene glycol monomethyl ether acetate, propylene glycol monomethyl ether propionate, and propylene glycol monoethyl ether acetate is preferable and propylene glycol monomethyl ether acetate is particularly preferable.

In addition, as propylene glycol monoalkyl ether, propylene glycol monomethyl ether or propylene glycol monoethyl ether is preferable.

As lactate, ethyl lactate, butyl lactate, or propyl lactate are preferable.

As acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As alkoxypropionic acid ester, methyl 3-methoxypropionate (MMP) or ethyl 3-ethoxypropionate (EEP) is preferable.

As linear ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetyl carbinol, acetophenone, methyl naphthyl ketone, or methyl amyl ketone is preferable.

As cyclic ketone, methyl cyclohexanone, isophorone, or cyclohexanone is preferable.

As lactone, γ-butyrolactone is preferable.

As alkylene carbonate, propylene carbonate is preferable.

In addition to the above-described components, the number of carbon atoms is greater than or equal to 7 (preferably 7 to 14, more preferably 7 to 12, and still more preferably 7 to 10), and it is preferable to use an ester-based solvent having 2 or less heteroatoms.

Preferred examples of an ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and it is particularly preferable to use isoamyl acetate.

In addition, it is preferable to use one having a flash point (hereinafter, also referred to as fp) of higher than or equal to 37° C. As such components (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or an ethyl lactate is particularly preferable. Here, the "flash point" means a value described in reagent catalogs of Tokyo Chemical Industry Co., Ltd. or Sigma-Aldrich Co. LLC.

At least one selected from the group consisting of water, propylene glycol monomethyl ether acetate (PGMEA), ethoxyethyl propionate, cyclohexanone, 2-heptanone, γ-butyrolactone, butyl acetate, propylene glycol monomethyl ether (PGME), ethyl lactate, and 4-methyl-2-pentanol is used as a preferred solvent, and at least one selected from the group consisting of PGMEA, and PGME is more preferable.

A content of the solvent in the composition of the embodiment of the present invention is preferably 80 mass % or more, is more preferably 85.0 mass % or more, and is even more preferably 88.0 mass % or more. In addition, the content of the above-described solvent in the above-described composition is preferably 99.9 mass % or less, and may be 95.0 mass % or less.

One kind or two or more kinds of the solvents may be contained in the composition of the embodiment of the present invention. In a case where the composition for forming an adhesive layer contains two or more kinds of solvents, the total amount is preferably within the above-described ranges.

<Critical Surface Tension>

In the composition of the embodiment of the present invention, a critical surface tension of a film formed of the components excluding the solvent from the composition is preferably 35 mN/m or less, and a critical surface tension after the treatment of a film formed of the component excluding the solvent from the composition is preferably 42 mN/m or more. Examples of films formed from the components excluding the solvent from the composition include a film formed by applying the composition of the embodiment of the present invention on a substrate without undergoing polarity conversion. The critical surface tension of the film formed from the components excluding the solvent from the composition in the present invention is measured according to a method described in a critical surface tension A described in Examples to be described later. In addition, the critical surface tension of a cured film of the composition of the embodiment of the present invention is measured according to a method described in a critical surface tension B described in Examples to be described later.

A critical surface tension of the film formed from the components excluding the solvent from the composition is preferably 15 to 35 mN/m, is more preferably 18 to 35 mN/m, is even more preferably 20 to 35 mN/m, and is still even more preferably 20 to 33 mN/m.

Furthermore, a critical surface tension after the treatment of the film formed of the components excluding the solvent from the composition is preferably 42 mN/m or more, is more preferably 43 mN/m or more, is even more preferably 44 mN/m or more, and is still even more preferably 45 mN/m or more. The upper limit value thereof is not particularly defined, but for example, 60 mN/m or less is exemplified.

A difference between the critical surface tension after the treatment of the film formed of the components excluding the solvent from the composition, and the critical surface tension of the film formed from the components excluding the solvent from the composition is preferably 7 to 30 mN/m.

<Other Alkylene Glycol Compound>

The composition of the embodiment of the present invention may contain an alkylene glycol compound not having a polymerizable group and a polarity conversion group (hereinafter, the other alkylene glycol compound), in addition to the compound 1 or the compound group 2 described above.

The other alkylene glycol compound preferably has 3 to 1,000 alkylene glycol constitutional units, more preferably has 4 to 500 alkylene glycol constitutional units, still more preferably has 5 to 100 alkylene glycol constitutional units, and still more preferably has 5 to 50 alkylene glycol constitutional units.

The weight-average molecular weight (Mw) of the other alkylene glycol compound is preferably 150 to 10,000, more preferably 200 to 5,000, still more preferably 300 to 3,000, and still more preferably 300 to 1,000.

Examples of alkylene glycol compounds include polyethylene glycol, polypropylene glycol, mono- or dimethyl ether thereof, mono- or dioctyl ether, mono- or dinonyl ether, mono- or didecyl ether, monostearic acid ester, monooleic acid ester, monoadipic acid ester, and monosuccinic acid ester, and polyethylene glycol and polypropylene glycol are preferable.

A surface tension of the other alkylene glycol compound at 25° C. is preferably greater than or equal to 38 mN/m and more preferably greater than or equal to 40 mN/m. The upper limit of the surface tension is not particularly limited, but is, for example, less than or equal to 48 mN/m. By blending such compounds, it is possible to further improve wettability of the curable composition for imprinting which will be provided immediately above an adhesive film.

In a case where the other alkylene glycol compound is contained, the content thereof is 40 mass % or less, is preferably 30 mass % or less, is more preferably 20 mass % or less, and is even more preferably 5 to 15 mass % of the solid content of the composition.

The other alkylene glycol compound may be used alone or in combination of two or more thereof. In a case where two or more kinds of the non-polymerizable alkylene glycol compounds are used, the total amount is preferably within the above-described ranges.

The composition of the embodiment of the present invention may contain an additive such as a surfactant within the scope not departing from the gist of the present invention in addition to the above. However, it is preferable that the composition of the embodiment of the present invention substantially not contain components other than the compound 1, the compound group 2, the solvent, and the other alkylene glycol compound. The phrase "substantially not containing" means that a content thereof is 0.001 mass % or less of the solid content of the composition.

The composition of the embodiment of the present invention may contain a polymerization initiator, but can also have a configuration in which a polymerization initiator is not substantially contained. The phrase "substantially not containing" means that a content thereof is 0.001 mass % or less of the solid content of the composition.

The composition of the embodiment of the present invention preferably contains 0.1 to 20 mass % of the components constituting the adhesive film such as the compound 1 and the compound group 2, and 80.0 to 99.9 mass % of the solvent.

The composition of the embodiment of the present invention is suitably used as a composition for forming an underlayer in applications of a curable composition, including a composition for forming an adhesive film for imprinting, a composition for forming an underlayer film for resist, and a composition for forming a topcoat for resist, and is preferably used for the composition for forming an adhesive film for imprinting.

It is possible to use a well-known storage container in the related art as a storage container of the composition used in the present invention. In addition, it is preferable to use a multilayer bottle obtained by forming the inner wall of a container with 6 types and 6 layers of resins or a bottle obtained by forming 6 kinds of resins into a 7-layer structure as the storage container in order to suppress mixing of impurities into a raw material or a composition. Examples of such a container include containers disclosed in JP2015-123351A.

<Method for Producing Cured Product Pattern>

The method for producing a cured product pattern of the embodiment of the present invention includes: an adhesive film formation step of forming an adhesive film by applying the composition of the embodiment of the present invention; an application step of applying the curable composition for imprinting onto a surface of the adhesive film; a mold contact step of bringing the curable composition for imprinting into contact with a mold having a pattern for transferring a pattern shape; a light irradiation step of irradiating the curable composition for imprinting with light to form a cured product; and a release step of separating the cured product and the mold from each other.

Hereinafter, a method for forming a cured product pattern (method for producing a cured product pattern) will be described according to FIG. 1. Needless to say, the configuration of the present invention is not limited to FIG. 1.

<<Adhesive Film Formation Step>>

In the adhesive film formation step, an adhesive film 2 is formed by applying the composition of the embodiment of the present invention onto a substrate 1 as shown in FIG. 1, for example. The surface of the substrate 1 may be subjected to surface treatment.

The method for applying the composition of the embodiment of the present invention onto a substrate is not particularly limited, and a disclosure of paragraph 0102 of JP2010-109092A (the publication number of its corresponding US application is US2011/183127) can be referred to, and the contents thereof are incorporated in the present specification. In the present invention, a spin coating method or an inkjet method is preferable.

More specifically, after applying the composition of the embodiment of the present invention onto a substrate, a solvent is preferably volatilized (dried) using heat or through light irradiation to form an adhesive film as a thin film.

The material of the substrate is not particularly limited, and a disclosure of paragraph 0103 of JP2010-109092A can be referred to, and the contents thereof are incorporated in the present specification. In addition to the above, examples thereof include a sapphire substrate, a silicon carbide substrate, a gallium nitride substrate, an aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGa, InP, or ZnO. Examples of specific materials of a glass substrate include aluminosilicate glass, aluminoborosilicate glass, and barium borosilicate glass. In the present invention, a silicon substrate is preferable.

The adhesive film of the embodiment of the present invention is formed of the composition of the embodiment of the present invention.

The thickness of an adhesive film is preferably greater than or equal to 0.1 nm, more preferably greater than or equal to 0.5 nm, and still more preferably greater than or equal to 1 nm. In addition, the thickness of an adhesive film is preferably less than or equal to 20 nm, more preferably less than or equal to 15 nm, and still more preferably less than or equal to 10 nm.

Accordingly, the above-described laminate of the embodiment of the present invention has a substrate and an adhesive film positioned on a surface of the above-described substrate, and the above-described adhesive film is the adhesive film formed of the composition of the embodiment of the present invention. In the present invention, the adhesive film preferably interacts with the above-described substrate. An example of the interaction here includes at least one selected from the group consisting of a covalent bond, an ionic bond, and a hydrogen bond.

<<Application Step>>

In the application step, a curable composition for imprinting 3 is applied on the surface of the above-described adhesive film 2 as shown in FIG. 1, for example.

The method for applying a curable composition for imprinting is not particularly limited, and a disclosure of paragraph 0102 of JP2010-109092A (the publication number of its corresponding US application is US2011/183127) can be referred to, and the contents thereof are incorporated in the present specification. The above-described application is preferably performed through an inkjet method. In addition, the curable composition for imprinting may be applied through multiple coating. In a method for disposing liquid droplets on the surface of an adhesive film through an inkjet method or the like, the amount of liquid droplets is preferably about 1 to 20 μL, and the liquid droplets are preferably disposed on the surface of the adhesive film at intervals between the liquid droplets. As the intervals between the liquid droplets, intervals of 10 to 1,000 μm are preferable. In the case of the inkjet method, the intervals between the liquid droplets are set as intervals at which inkjet nozzles are disposed.

Furthermore, the volume ratio of the film-shaped curable composition for imprinting 3 to the adhesive film 2 when applied onto the substrate is preferably 1:1 to 1:500, more preferably 1:10 to 1:300, and still more preferably 1:50 to 1:200.

The details of the curable composition for imprinting will be described below.

In other words, the present invention discloses the laminate that includes a layer formed from the curable composition for imprinting on a surface of the adhesive film.

<<Mold Contact Step>>

In the mold contact step, the above-described curable composition for imprinting 3 is brought into contact with a mold 4 having a pattern for transferring a pattern shape as shown in FIG. 1, for example. Through such steps, a desired cured product pattern (imprint pattern) is obtained.

Specifically, in order to transfer a desired pattern to a film-shaped curable composition for imprinting, the mold 4 is brought into press contact with the surface of the film-shaped curable composition for imprinting 3.

The mold may be a light-transmitting mold or a light non-transmitting mold. In a case where a light-transmitting mold is used, it is preferable to radiate light from the mold side. On the other hand, in a case where a light non-transmitting mold is used, it is preferable to use a light-transmitting substrate as a substrate to radiate light from the substrate side. In the present invention, it is preferable to radiate light from a mold side using a light-transmitting mold.

A mold which can be used in the present invention is a mold having a pattern to be transferred. Regarding the pattern of the above-described mold, it is possible to form a pattern according to a desired processing accuracy, for example, through photolithography, or an electron beam drawing method. In the present invention, the mold pattern producing method is not particularly limited. In addition, it is possible to use a pattern formed through the method for producing a cured product pattern of the embodiment of the present invention as a mold.

Materials constituting the light-transmitting mold used in the present invention are not particularly limited. Examples thereof include glass, quartz, polymethyl methacrylate (PMMA), a light-transmitting resin such as a polycarbonate resin, a transparent metal vapor deposition film, a flexible film such as polydimethylsiloxane, a photocured film, and a metal film, and quartz is preferable.

Materials of the light non-transmitting mold used in a case where a light-transmitting substrate of the present invention is used are not particularly limited, but may have a predetermined strength. Specific examples thereof include a ceramic material, an vapor deposition film, a magnetic film, a reflective film, a metal substrate of Ni, Cu, Cr, Fe or the like, a substrate of SiC, silicon, silicon nitride, polysilicon, silicon oxide, amorphous silicon, or the like, but are not particularly restricted.

In the above-described method for producing a cured product pattern, in a case where imprint lithography is performed using a curable composition for imprinting, it is preferable to set the mold pressure to be less than or equal to 10 atm. By setting the mold pressure to be less than or equal to 10 atm, it is difficult for a mold and a substrate to deform, and the pattern accuracy tends to improve. In addition, it is preferable from the viewpoint that the size of a device tends to be reduced due to low pressurization. The mold pressure is preferably selected from a range within which the uniformity of mold transfer can be secured within a range where a residual film of a curable composition for imprinting of a mold convex portion is reduced.

In addition, it is also preferable to bring the curable composition for imprinting into contact with the mold in an atmosphere containing helium gas or condensable gas or containing both helium gas and condensable gas.

<<Light Irradiation Step>>

In the light irradiation step, the above-described curable composition for imprinting is irradiated with light to form a cured product. The irradiation dose of light irradiation in the light irradiation step may be sufficiently larger than the minimum irradiation dose required for hardening. The irradiation amount necessary for hardening is appropriately determined by investigating the amount of consumption of unsaturated bonds of the curable composition for imprinting or the like.

The type of light to be radiated is not particularly limited, but an example thereof includes ultraviolet light.

In addition, regarding the temperature of a substrate in a case of light irradiation in imprint lithography applied to the present invention, light irradiation is usually performed at room temperature, but may be performed while heating in order to enhance the reactivity. In a case where the environment is kept in a vacuum condition as a preliminary stage of light irradiation, it is effective to prevent air bubbles from being mixed in, suppress a decrease in reactivity due to oxygen mixed in, and improve the adhesiveness between a mold and a curable composition for imprinting. Therefore, light irradiation may be performed in a vacuum condition. In addition, in the above-described method for producing a cured product pattern, the preferred degree of vacuum at the time of light irradiation is within a range of $10^{-1}$ Pa to an atmospheric pressure.

In a case of exposure, it is desirable to set the exposure illuminance to be within a range of 1 $mW/cm^2$ to 500 $mW/cm^2$.

The above-described method for producing a cured product pattern may include a step of hardening a film-shaped curable composition for imprinting (pattern forming layer) through light irradiation, and then, further hardening the hardened pattern by adding heat as necessary. The temperature for heating and hardening a curable composition for imprinting after light irradiation is preferably 150° C. to 280° C. and more preferably 200° C. to 250° C. In addition, the time for applying heat is preferably 5 to 60 minutes and more preferably 15 to 45 minutes.

<<Release Step>>

In the release step, the above-described cured product and the above-described mold are separated from each other. The obtained cured product pattern can be used for various applications as will be described below.

In other words, the present invention discloses the laminate that includes a cured product pattern formed of the curable composition for imprinting on the surface of the adhesive film.

Furthermore, as will be described below, etching or the like can also be performed.

<Cured Product Pattern and Applications Thereof>

A cured product pattern formed through the above-described method for producing a cured product pattern as described above can be used as a permanent film used in a liquid crystal display device (LCD) or the like or an etching resist for manufacturing a semiconductor element (lithography mask).

In particular, the present invention discloses a method for manufacturing a circuit substrate, the method including a step of obtaining a cured product pattern through the method for producing a cured product pattern of the embodiment of the present invention. Furthermore, the method for manufacturing a circuit substrate of the embodiment of the present invention may further include a step of performing etching or ion implantation on a substrate using a cured product pattern obtained by the above-described method for producing a cured product pattern as a mask, and a step of forming an electronic member. The above-described circuit substrate is preferably a semiconductor element. Furthermore, the present invention discloses a method for manufacturing an electronic device, the method including a step of obtaining a circuit substrate through the above-described method for manufacturing a circuit substrate and a step of connecting the above-described circuit substrate to a control mechanism that controls the above-described circuit substrate.

In addition, it is possible to form a grid pattern on a glass substrate of a liquid crystal display device using the pattern formed through the above-described method for producing a cured product pattern to manufacture a polarizing plate having a large screen size (for example, larger than 55 inches or 60 inches) with little reflection and absorption at low cost. For example, polarizing plates disclosed in JP2015-132825A or WO2011/132649A can be manufactured. 1 inch is 25.4 mm.

The cured product pattern formed in the present invention is also useful as an etching resist (lithography mask) as shown in FIG. 1. In a case of using a cured product pattern as an etching resist, a fine cured product pattern is first formed on a substrate, for example, in a nano or micron order through the above-described method for producing a cured product pattern using a silicon substrate (such as silicon wafer) in which, for example, a thin film of $SiO_2$ or the like, is formed as a substrate. In the present invention, it is particularly beneficial from the viewpoint that it is possible to form a fine pattern in a nano order, and it is also possible to form a pattern having a size of less than or equal to 50 nm and particularly a size of less than or equal to 30 nm. The lower limit value of the size of the cured product pattern formed through the above-described method for producing a cured product pattern is not particularly specified, but can be set to be, for example, greater than or equal to 1 nm.

In addition, the present invention also discloses a method for manufacturing a mold for imprinting, the method including a step of obtaining a cured product pattern on a substrate through the method for producing a cured product pattern of the embodiment of the present invention and a step of performing etching on the above-described substrate using the obtained cured product pattern.

A desired cured product pattern can be formed on a substrate by etching with hydrogen fluoride or the like in a case of wet etching or with etching gas such as $CF_4$ in a case of dry etching. The cured product pattern has good etching resistance, particularly to dry etching. That is, the pattern formed through the above-described method for producing a cured product pattern is preferably used as a lithography mask.

Specifically, the pattern formed in the present invention can be preferably used for producing a recording medium such as a magnetic disk, a light-receiving element such as a solid image pickup element, a light emitting element such as a light emitting diode (LED) or organic electroluminescence (organic EL), an optical device such as a liquid crystal display (LCD) device, a diffraction grating, a relief hologram, optical components such as an optical waveguide, an optical filter, and a microlens array, a thin film transistor, an organic transistor, a color filter, an anti-reflection film, a polarizing plate, a polarizing element, an optical film, flat panel display member such as a column material, a nano-biodevice, an immunological analysis chip, deoxyribonucleic acid (DNA) separation chip, a microreactor, photonic liquid crystal, a guide pattern for forming a fine pattern (directed self-assembly, DSA) using self-assembly of a block copolymer, and the like.

<Curable Composition for Imprinting>

Next, the curable composition for imprinting used in the present invention will be described.

The curable composition for imprinting used in the present invention is not particularly limited, and a well-known curable composition for imprinting can be used, and the curable composition for imprinting preferably contains at least a polymerizable compound.

In the present invention, it is preferable that the viscosity of the curable composition for imprinting is designed to be low and the surface tension is designed to be high so as to enable high-speed filling into a mold pattern using a capillary force.

Specifically, the viscosity of the curable composition for imprinting at 23° C. is preferably less than or equal to 20.0 mPa·s, more preferably less than or equal to 15.0 mPa·s, and still more preferably less than or equal to 11.0 mPa·s. The lower limit value of the above-described viscosity is not particularly limited, but can be set to be, for example, greater than or equal to 5.0 mPa·s.

In addition, the surface tension of the curable composition for imprinting at 25° C. is preferably greater than or equal to 30 mN/m and more preferably greater than or equal to 32 mN/m. In a case where a curable composition for imprinting with a high surface tension is used, the capillary force increases, which enables high-speed filling of a mold pattern with the curable composition for imprinting. The upper limit value of the above-described surface tension is not particularly limited, but is preferably less than or equal to 40 mN/m and more preferably less than or equal to 38 mN/m from the viewpoint of imparting inkjet suitability.

The present invention is highly meaningful from the viewpoint that use of a predetermined adhesive film improves wettability of a curable composition for imprinting which has a high surface tension and poor wettability on an adhesive film while having a high capillary force and good filling properties into a mold pattern.

The surface tension of curable composition for imprinting at 25° C. is measured according to a method to be described in examples below.

In the present invention, the content of a solvent in the curable composition for imprinting is preferably less than or equal to 5 mass %, more preferably less than or equal to 3 mass %, and still more preferably less than or equal to 1 mass % with respect to the curable composition for imprinting.

In addition, it is possible to employ an aspect in which the curable composition for imprinting used in the present invention does not substantially contain a polymer (polymer having a weight-average molecular weight of preferably greater than 1,000, more preferably greater than 2,000, and still more preferably greater than or equal to 10,000). The expression "does not substantially contain a polymer" means, for example, that the content of a polymer is 0.01 mass % or less of the curable composition for imprinting and is preferably 0.005 mass % or less. It is more preferable that the curable composition for imprinting contain no polymer at all.

<<Polymerizable Compound>>

The polymerizable compound contained in the curable composition for imprinting used in the present invention may be a monofunctional polymerizable compound or a polyfunctional polymerizable compound, or a mixture of both compounds. In addition, it is preferable that at least a part of a polymerizable compound contained in the curable composition for imprinting is a liquid at 25° C. and it is more preferable that greater than or equal to 15 mass % of a polymerizable compound contained in the curable composition for imprinting is a liquid at 25° C.

The type of monofunctional polymerizable compound used in the curable composition for imprinting is not particularly defined as long as the type thereof does not depart from the gist of the present invention.

The molecular weight of the monofunctional polymerizable compound used in the curable composition for imprinting is preferably greater than or equal to 100, more preferably greater than or equal to 200, and still more preferably greater than or equal to 220. The molecular weight is preferably less than or equal to 1,000, more preferably less than or equal to 800, still more preferably less than or equal to 300, and particularly preferably less than or equal to 270. In a case where the lower limit value of the molecular weight is set to be greater than or equal to 100, there is a tendency that it is possible to suppress the volatility. In a case where the upper limit value of the molecular weight is set to be less than or equal to 1,000, there is a tendency that it is possible to reduce the viscosity.

The boiling point of the monofunctional polymerizable compound used in the curable composition for imprinting at 667 Pa is preferably greater than or equal to 85° C., more preferably greater than or equal to 110° C., and still more preferably greater than or equal to 130° C. By setting the boiling point at 667 Pa to be greater than or equal to 85° C., it is possible to suppress the volatility. The upper limit value of the boiling point is not particularly specified, but the boiling point at 667 Pa can be set, for example, to be less than or equal to 200° C.

The kind of polymerizable group included in the monofunctional polymerizable compound used in the curable composition for imprinting is not particularly specified, but is, for example, an ethylenically unsaturated group and an epoxy group and preferably an ethylenically unsaturated group. Examples of ethylenically unsaturated groups include a (meth)acryloyl group and a vinyl group, and are more preferably a (meth)acryloyl group, and are even more preferably an acryloyl group. In addition, the (meth)acryloyl group is preferably a (meth)acryloyloxy group.

The kinds of atoms constituting the monofunctional polymerizable compound used in the curable composition for imprinting is not particularly specified, but the monofunctional polymerizable compound thereof is preferably constituted of only atoms selected from carbon atoms, oxygen atoms, hydrogen atoms, and halogen atoms, and is more preferably constituted of only atoms selected from carbon atoms, oxygen atoms, and hydrogen atoms.

The preferred first embodiment of the monofunctional polymerizable compound used in the curable composition for imprinting is a compound having a linear or branched hydrocarbon chain having 4 or more carbon atoms.

The hydrocarbon chain in the present invention represents an alkyl chain, an alkenyl chain, and an alkynyl chain, preferably an alkyl chain and an alkenyl chain, and more preferably an alkyl chain.

In the present invention, the alkyl chain represents an alkyl group and an alkylene group. Similarly, the alkenyl chain represents an alkenyl group and an alkenylene group, and the alkynyl chain represents an alkynyl group and an alkynylene group. Among these, a linear or branched alkyl group or alkenyl group is more preferable, a linear or branched alkyl group is still more preferable, and a linear alkyl group is still more preferable.

The above-described linear or branched hydrocarbon chain (preferably, alkyl group) has 4 or more carbon atoms, preferably has 6 or more carbon atoms, more preferably has 8 or more carbon atoms, still more preferably 10 or more carbon atoms, and particularly preferably 12 or more carbon atoms. The upper limit value of the number of carbon atoms is not particularly specified, but the number of carbon atoms can be set, for example, to be less than or equal to 25.

The above-described linear or branched hydrocarbon chain may contain an ether group (—O—), but preferably has no ether group from the viewpoint of improving the releasability.

By using a relatively small addition amount of such a monofunctional polymerizable compound having a hydrocarbon chain, the elasticity of a cured product (pattern) is reduced and the releasability improves. In addition, in a case where a monofunctional polymerizable compound having a linear or branched alkyl group is used, the interfacial energy between a mold and a cured product (pattern) is reduced, and therefore, it is possible to further improve the releasability.

Examples of a preferred hydrocarbon group included in the monofunctional polymerizable compound used in the curable composition for imprinting include (1) to (3).

(1) Linear alkyl groups having 8 or more carbon atoms (2) Branched alkyl groups having 10 or more carbon atoms (3) Alicyclic or Aromatic Ring Substituted with Linear or Branched Alkyl Group Having 5 or More Carbon Atoms (1) Linear Alkyl Groups Having 8 or More Carbon Atoms Among the linear alkyl groups having 8 or more carbon atoms, branched alkyl groups having 10 or more carbon atoms are more preferable, branched alkyl groups having 11 or more carbon atoms are still more preferable, and branched alkyl groups having 12 or more carbon atoms are particularly preferable. In addition, linear alkyl groups having 20 or less carbon atoms are preferable, linear alkyl groups having 18 or less carbon atoms are more preferable, linear alkyl groups having 16 or less carbon atoms are still more preferable, and linear alkyl groups having 14 or less carbon atoms are particularly preferable.

(2) Branched Alkyl Groups Having 10 or More Carbon Atoms

Among the above-described branched alkyl groups having 10 or more carbon atoms, branched alkyl groups having 10 to 20 carbon atoms are preferable, branched alkyl groups having 10 to 16 carbon atoms are more preferable, branched alkyl groups having 10 to 14 carbon atoms are still more preferable, and branched alkyl groups having 10 to 12 carbon atoms are particularly preferable.

(3) Alicyclic or Aromatic Ring Substituted with Linear or Branched Alkyl Group Having 5 or More Carbon Atoms The linear or branched alkyl group having 5 or more carbon atoms is more preferably a linear alkylene group. The number of carbon atoms in the above-described alkyl group is still more preferably 6 or more, still more preferably 7 or more, and still more preferably 8 or more. The number of carbon atoms in the alkyl group is preferably 14 or less, more preferably 12 or less, and still more preferably 10 or less.

A ring of an alicyclic or aromatic ring may be a monocyclic ring or a fused ring, but is preferably a monocyclic ring. In a case where the ring thereof is a fused ring, the number of rings is preferably 2 or 3. The ring is preferably a 3- to 8-membered ring, more preferably a 5- to 6-membered ring, and still more preferably a 6-membered ring. In addition, the ring is an alicyclic ring or an aromatic ring, but is preferably an aromatic ring. Specific examples of the ring include a cyclohexane ring, a norbornane ring, an isobornane ring, a tricyclodecane ring, a tetracyclododecane ring, an adamantane ring, a benzene ring, a naphthalene ring, an anthracene ring, and a fluorene ring, among which a cyclohexane ring, a tricyclodecane ring, an adamantane ring, and a benzene ring are more preferable and a benzene ring is still more preferable.

The monofunctional polymerizable compound used in the curable composition for imprinting is preferably a compound in which a linear or branched hydrocarbon chain having 4 or more carbon atoms is directly bonded to a polymerizable group or through a linking group, and is more preferably a compound in which any one of the above-described (1) to (3) is directly bonded to a polymerizable group. Examples of the linking group include —O—, —C(=O)—, —CH$_2$—, or a combination thereof. Linear alkyl (meth)acrylate in which a (1) linear alkyl group having 8 or more carbon atoms is directly bonded to a (meth)acryloyloxy group is particularly preferable as the monofunctional polymerizable compound used in the present invention.

Examples of the monofunctional polymerizable compound of the first embodiment include the following first group and second group. However, it goes without saying that the present invention is not limited thereto. In addition, the first group is more preferable than the second group.

First Group

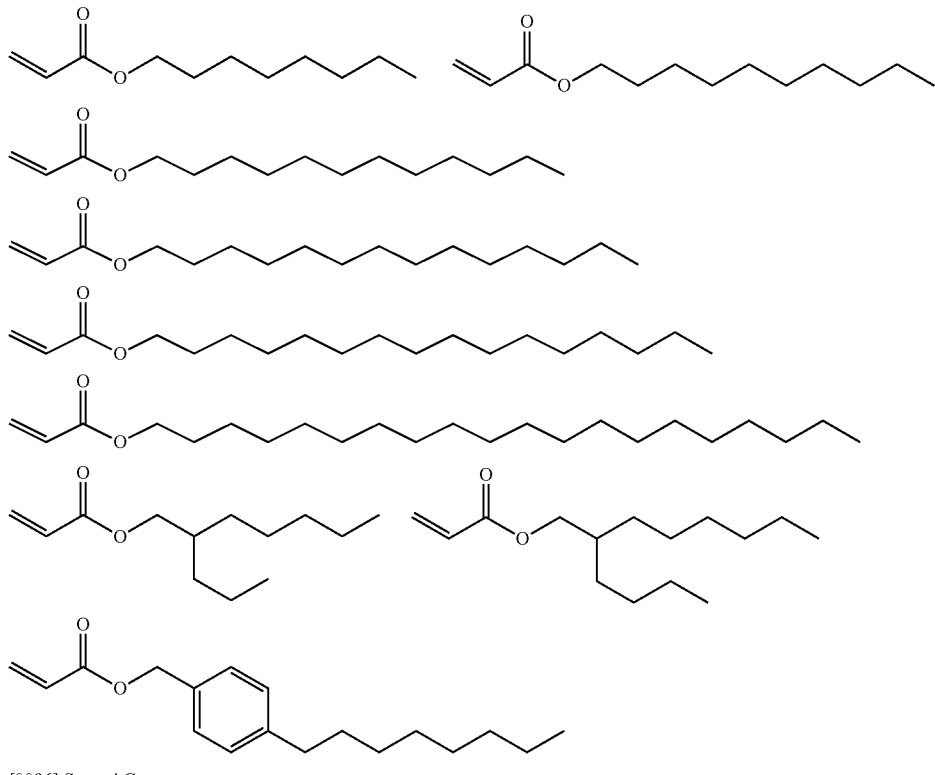

[0096] Second Group

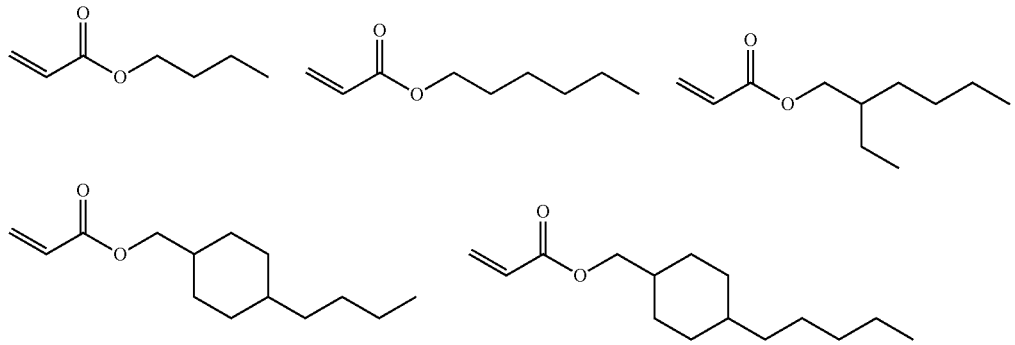

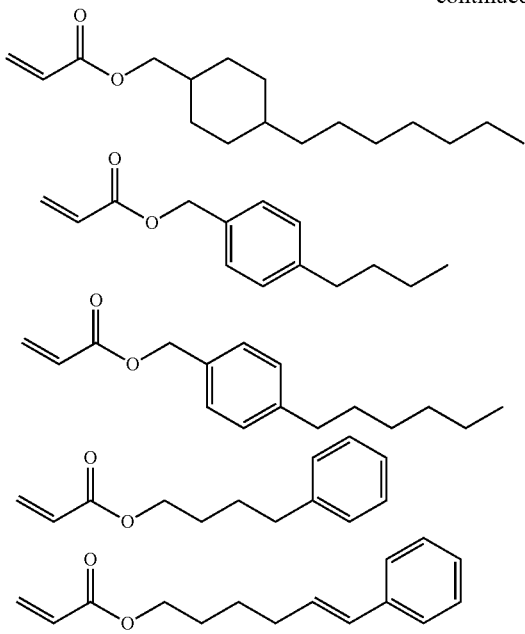

The preferred second embodiment of the monofunctional polymerizable compound used in the curable composition for imprinting is a compound having a cyclic structure. The cyclic structure is preferably a 3- to 8-membered monocyclic ring or a fused ring. The number of rings constituting the above-described fused ring is preferably 2 or 3. The cyclic structure is more preferably a 5- to 6-membered ring and still more preferably a 6-membered ring. In addition, a monocyclic ring is more preferable.

The number of cyclic structures in a molecule of a polymerizable compound may be 1 or 2 or more, but is preferably 1 or 2 and more preferably 1. In a case of a fused ring, the fused ring is considered as a cyclic structure.

Examples of the monofunctional polymerizable compound of the second embodiment include the following compounds. However, it goes without saying that the present invention is not limited thereto.

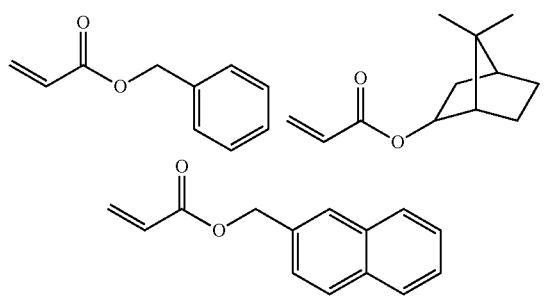

In the present invention, a monofunctional polymerizable compound other than the above-described monofunctional polymerizable compound may be used as long as it does not depart from the gist of the present invention. An example thereof includes a monofunctional polymerizable compound among the polymerizable compounds disclosed in JP2014-170949A, and the contents thereof are included in the present specification.

In a case where the curable composition for imprinting contains a monofunctional polymerizable compound, the content of the monofunctional polymerizable compound used in the curable composition for imprinting with respect to the total polymerizable compound in the curable composition for imprinting is preferably greater than or equal to 6 mass %, more preferably greater than or equal to 8 mass %, still more preferably greater than or equal to 10 mass %, and particularly preferably greater than or equal to 12 mass %. In addition, the above-described content is more preferably less than or equal to 60 mass %, and may be less than or equal to 55 mass %.

Only one kind or two or more kinds of monofunctional polymerizable compounds may be contained in the present invention. In a case where the composition for forming an adhesive layer contains two or more kinds of solvents, the total amount is preferably within the above-described ranges.

On the other hand, the polyfunctional polymerizable compound used in the curable composition for imprinting is not particularly limited, but preferably contains at least one of an alicyclic ring and an aromatic ring and more preferably contains an aromatic ring. In some cases, a compound containing at least one of an alicyclic ring and an aromatic ring may be referred to as a ring-containing polyfunctional polymerizable compound in the description below. By using the ring-containing polyfunctional polymerizable compound in the present invention, it is possible to more effectively suppress etching processing characteristics, particularly breakage of a pattern after etching. It is estimated that this is because an etching selection ratio with a processing object (for example, Si, Al, Cr, or an oxide thereof) in a case of etching processing improves.

The molecular weight of the ring-containing polyfunctional polymerizable compound used in the curable composition for imprinting is preferably less than or equal to 1,000, more preferably less than or equal to 800, still more preferably less than or equal to 500, and still more preferably less than or equal to 350. In a case where the upper limit value of the molecular weight is set to be less than or equal to 1,000, there is a tendency that it is possible to reduce the viscosity.

The lower limit value of the molecular weight is not particularly specified, but the molecular weight can be set, for example, to be greater than or equal to 200.

The number of polymerizable groups contained in the ring-containing polyfunctional polymerizable compound used in the curable composition for imprinting is 2 or more, preferably 2 to 7, more preferably 2 to 4, still more preferably 2 or 3, and particularly preferably 2.

The kind of polymerizable group included in the ring-containing polyfunctional polymerizable compound used in the curable composition for imprinting is not particularly specified, but is, for example, an ethylenically unsaturated bond-containing group and an epoxy group and preferably an ethylenically unsaturated bond-containing group. Examples of the ethylenically unsaturated bond-containing group include a (meth)acryloyl group and a vinyl group, more preferably a (meth)acryloyl group, and still more preferably an acryloyl group. In addition, the (meth)acryloyl group is preferably a (meth)acryloyloxy group. Two or more kinds of polymerizable groups may be contained in one molecule, or two or more polymerizable groups of the same kind may be contained therein.

The kinds of atoms constituting the ring-containing polyfunctional polymerizable compound used in the curable composition for imprinting is not particularly specified, but the monofunctional polymerizable compound thereof is preferably constituted of only atoms selected from carbon atoms, oxygen atoms, hydrogen atoms, and halogen atoms, and is more preferably constituted of only atoms selected from carbon atoms, oxygen atoms, and hydrogen atoms.

The ring contained in the ring-containing polyfunctional polymerizable compound used in the curable composition for imprinting may be a monocyclic ring or a condensed ring, but it is preferably a monocyclic ring. In a case where the ring thereof is a fused ring, the number of rings is preferably 2 or 3. The ring is preferably a 3- to 8-membered ring, more preferably a 5- to 6-membered ring, and still more preferably a 6-membered ring. In addition, the ring may be an alicyclic ring or an aromatic ring, but is preferably an aromatic ring. Specific examples of the ring include a cyclohexane ring, a norbornane ring, an isobornane ring, a tricyclodecane ring, a tetracyclododecane ring, an adamantane ring, a benzene ring, a naphthalene ring, an anthracene ring, and a fluorene ring, among which a cyclohexane ring, a tricyclodecane ring, an adamantane ring, and a benzene ring are more preferable and a benzene ring is still more preferable.

The number of rings in the ring-containing polyfunctional polymerizable compound used in the curable composition for imprinting may be 1 or 2 or more, but is preferably 1 or 2 and more preferably 1. In a case of a condensed ring, it is considered that the number of condensed rings is 1.

The ring-containing polyfunctional polymerizable compound used in the curable composition for imprinting is preferably represented by (polymerizable group)-(single bond or divalent linking group)-(divalent group having ring)-(single bond or a divalent linking group)-(polymerizable group). Here, as the linking group, an alkylene group is more preferable, and an alkylene group having 1 to 3 carbon atoms is more preferable.

The ring-containing polyfunctional polymerizable compound used in the curable composition for imprinting is preferably represented by Formula (1-1).

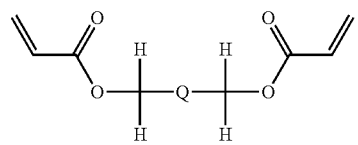

In Formula (1-1), Q represents a divalent group having an alicyclic ring or an aromatic ring.

The preferred range of an alicyclic ring or an aromatic ring in Q is the same as the above.

Examples of the polyfunctional polymerizable compound used in the curable composition for imprinting include the following first group and second group. However, it goes without saying that the present invention is not limited thereto. The first group is more preferable.

First Group

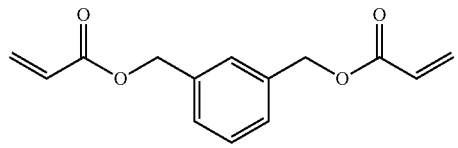

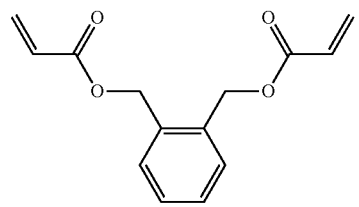

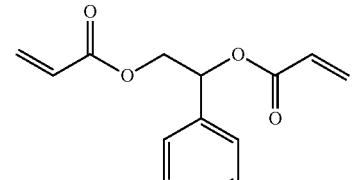

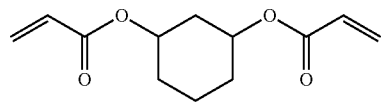

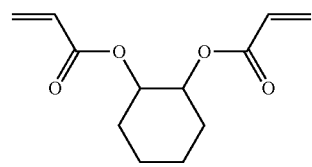

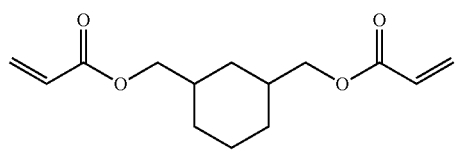

-continued

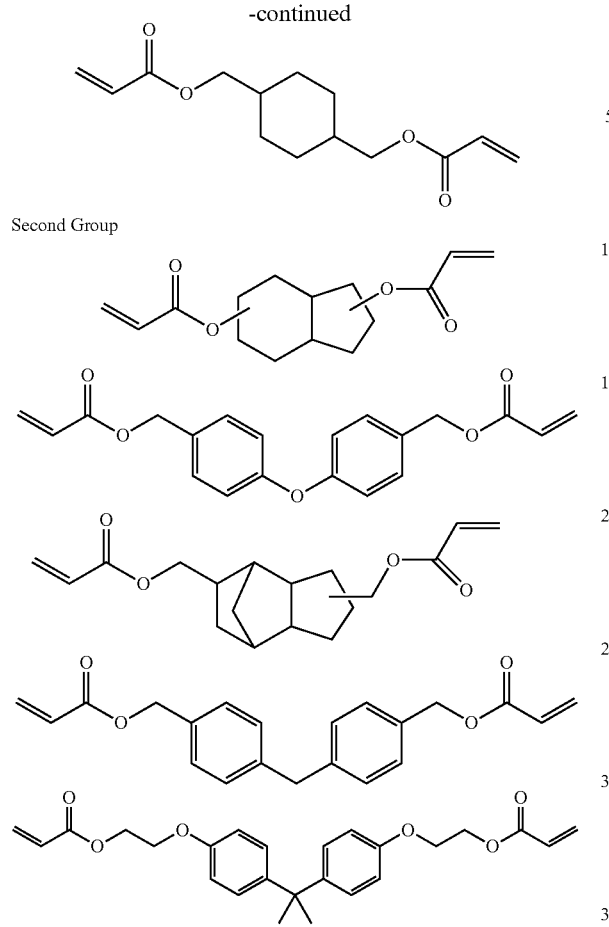

Second Group

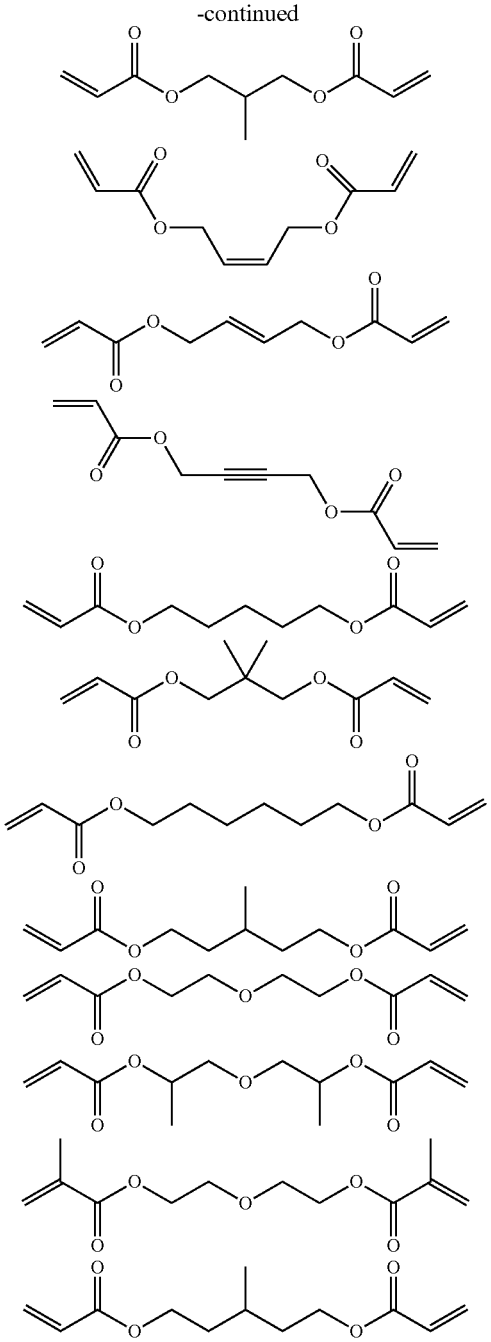

-continued

The curable composition for imprinting may contain other polyfunctional polymerizable compounds besides the above-described ring-containing polyfunctional polymerizable compound.

Examples of the other polyfunctional polymerizable compounds used in the curable composition for imprinting include polyfunctional polymerizable compounds having no ring among the polymerizable compounds disclosed in JP2014-170949A, and the contents thereof are included in the present specification. More specifically, for example, the following compounds are exemplified.

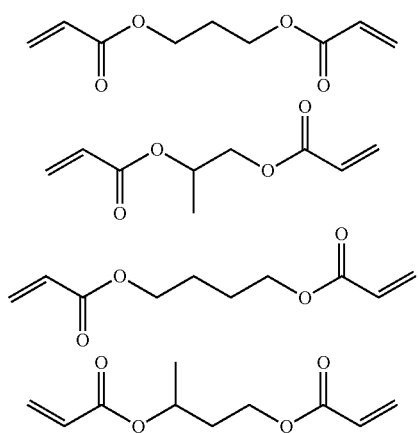

The polyfunctional polymerizable compound with respect to the total polymerizable compound is preferably contained in the curable composition for imprinting in an amount of greater than or equal to 30 mass %, more preferably greater than or equal to 45 mass %, still more preferably greater than or equal to 50 mass %, and still more preferably greater than or equal to 55. The polyfunctional polymerizable compound may be contained therein in an amount of greater than or equal to 60 mass % or an amount of greater than or equal to 70 mass %. In addition, the upper limit value is preferably less than 95 mass %, more preferably less than or equal to 90 mass %, and can also be set to be less than or equal to 85 mass %. By particularly setting the content of the above-described ring-containing polyfunctional polymerizable compound to be greater than or equal to 30 mass % of the total polymerizable compound, the etching selection ratio with a processing object (for example, Si, Al, Cr, or an oxide thereof) in a case of etching processing improves, and therefore, it is possible to suppress breakage of a pattern after etching processing.

The curable composition for imprinting may contain only one kind of polyfunctional polymerizable compound or two or more kinds of polyfunctional polymerizable compounds. In a case where the composition for forming an adhesive layer contains two or more kinds of solvents, the total amount is preferably within the above-described ranges.

In the curable composition for imprinting used in the present invention, it is preferable that greater than or equal to 85 mass % of the composition is the polymerizable compound, it is more preferable that greater than or equal to 90 mass % of the composition is the polymerizable compound, and it is still more preferable that greater than or equal to 93 mass % of the composition is the polymerizable compound.

<Other Components>

The curable composition for imprinting may contain an additive other than the polymerizable compound. An example of the other additive includes a photopolymerization initiator. Furthermore, the curable composition for imprinting may contain a sensitizer, a releasing agent, an antioxidant, a polymerization inhibitor, a solvent, and the like.

Each component disclosed in JP2013-036027A, JP2014-090133A, and JP2013-189537A can be used as a photopolymerization inhibitor, a sensitizer, a releasing agent, an antioxidant, a polymerization inhibitor, a solvent, and the like in addition to components to be described in examples below. The disclosures of the above-described gazettes can also be referred to for the content and the like.

Specific examples of the curable composition for imprinting that can be used in the present invention include compositions to be described in examples below, and compositions disclosed in JP2013-036027A, JP2014-090133A, and JP2013-189537A, and the contents thereof are incorporated into the present specification. In addition, the disclosures of the above-described publications can also be referred to for a method for preparing a curable composition for imprinting and forming and a method for forming a film (pattern forming layer), and the contents thereof are incorporated into the present specification.

It is possible to use a well-known storage container in the related art as a storage container of the curable composition for forming an adhesive film used in the present invention. In addition, it is preferable to use a multilayer bottle obtained by forming the inner wall of a container with 6 types and 6 layers of resins or a bottle obtained by forming 6 kinds of resins into a 7-layer structure as the storage container in order to suppress mixing of impurities into a raw material or a composition. Examples of such a container include containers disclosed in JP2015-123351A.

EXAMPLES

Hereinafter, the present invention will be more specifically described with reference to examples. The material, the usage, the proportion, treatment contents, a treatment procedure, and the like shown in Examples below can be appropriately changed without departing from the gist of the present invention. Accordingly, the range in the present invention is not limited to specific examples shown below.

Synthesis Example 1: Synthesis of Resin A-8

<<Synthesis of Intermediate A-8a of Resin A-8>

PGME (32.4 g) was added to a three-neck flask in which $N_2$ was flowing, and heated to 90° C. Polyethylene glycol monomethacrylate (manufactured by Nippon Yushi Co., Ltd., BLEMMER PE-350, 21.9 g, 49.9 mmol) and a photo radical polymerization initiator (manufactured by Wako Pure Chemical Industries, Ltd., V-601, 1.0 g, 4.3 mmol) were dissolved in PGME (32.4 g). The obtained mixture was added dropwise over 2 hours at a temperature at which an internal temperature of the flask did not exceed 95° C., and aged at 90° C. for 4 hours. Thereafter, the mixture was cooled to 25° C. Diisopropyl ether (DIPE, 435.5 g) and isopropyl alcohol (IPA, 186.6 g) were added to another three-neck flask, and the mixture was cooled to −20° C. and stirred. The reaction liquid of the above-described flask was added dropwise thereto over 30 minutes at a temperature not exceeding −15° C., and stirred for 1 hour. Thereafter, it was allowed to stand for 1 hour, and a supernatant was removed. A target compound (an intermediate A-8a) was synthesized by drying the obtained viscous liquid under reduced pressure.

<<Synthesis of Resin A-8>>

The intermediate A-8a (25.9 g, 59.1 mmol), acrylonitrile chloride (2.94 g, 32.50 mmol), pentafluorobenzenesulfonyl chloride (8.66 g, 32.50 mmol), and tetrahydrofuran (THF, 112.5 g) were added to a three-neck flask in which $N_2$ was flowing, and cooled to 0° C. $Et_3N$ (triethylamine, 8.97 g, 88.7 mmol) was added dropwise over 0.5 hours at a temperature at which an internal temperature of the flask did not exceed 15° C., and the mixture was aged 25° C. for 5 hours. Thereafter, filtration was performed, and ethyl acetate (800 mL) and distilled water (500 mL) were added to the filtrate, and liquid separation was performed. The aqueous layer was removed, and 1M HCl (500 mL) was added for liquid separation. The aqueous layer was removed, and 500 mL of distilled water was added for liquid separation. The organic layer was concentrated, and 37.5 g of ethyl acetate was added. DIPE (100 g, IPA, 303 g) and 23 g of distilled water were added to another three-neck flask, and the mixture was cooled to −20° C. and stirred. The reaction liquid of the above-described flask was added dropwise thereto over 30 minutes at a temperature not exceeding −15° C., and stirred for 1 hour. Thereafter, it was allowed to stand for 1 hour, and a supernatant was removed. A target compound was synthesized by drying the obtained viscous liquid under reduced pressure.

Synthesis Example 2

Resins A-1 to A-7, resins A-9 to A-19 and A-22 to 30, and resins H-1 to H-4 were synthesized according to Synthesis Example 1.

The structure of each resin is shown below. A molar ratio of a left side repeating unit to a right side repeating unit in all resins A-1 to A-13, A-17, A-19, and A-22, and resins H-1, H-2, and H-4 is 50:50. Furthermore, a molar ratio of a left side repeating unit to a central repeating unit to a right side repeating unit of the resins A-14 to A-16 and A-22 is 45:45:10. Furthermore, a molar ratio of a left side repeating unit to a central repeating unit to a right side repeating unit of the resins A-23 to A-26 is 40:50:10. Furthermore, a molar ratio of each repeating unit of the resins A-27 and A-28 is 30:40:20:10 in order from a left side repeating unit. Furthermore, a molar ratio of a left side repeating unit to a central repeating unit to a right side repeating unit of the resin A-29 is 40:55:5. Furthermore, a molar ratio of a left side repeating unit and a right side repeating unit of the resin A-30 is 80:20.

* is a bonding site to another repeating unit. In addition, each n is an average value.

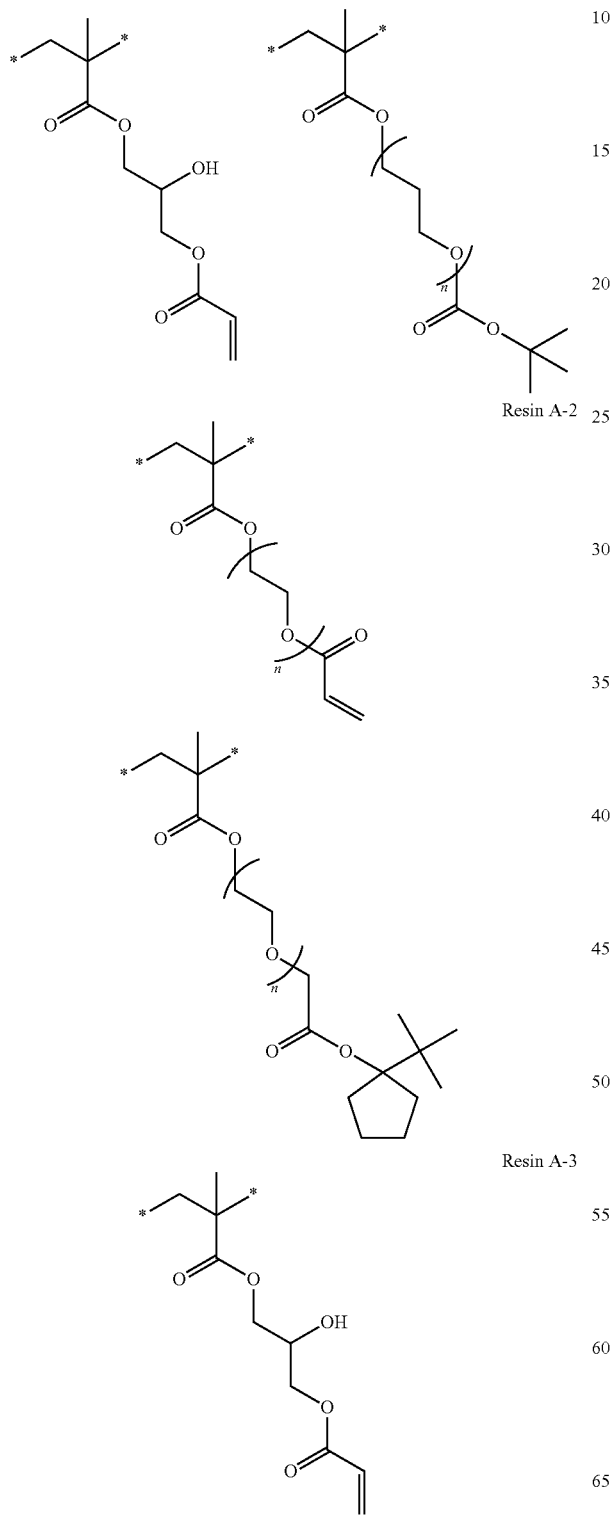

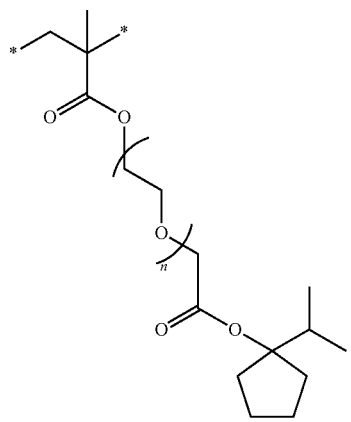

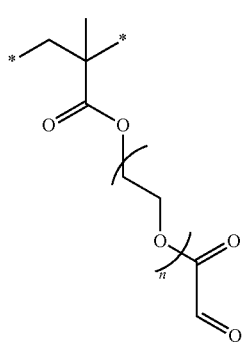

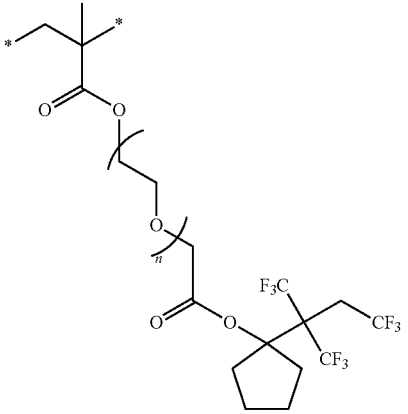

In the resin A-1, n is 90.

In the above resin A-2, n of the left side repeating unit is 90, and n of the right side repeating unit is 90.

In the above resin A-3, n is 90.

In the above resin A-4, n of the left side repeating unit is 90, and n of the right side repeating unit is 90.

Resin A-5
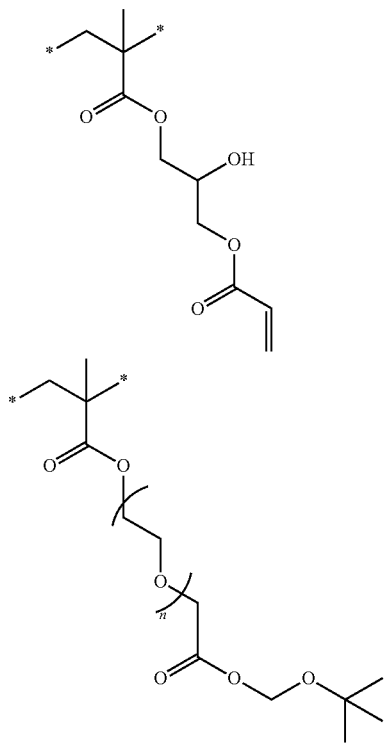
Resin A-6
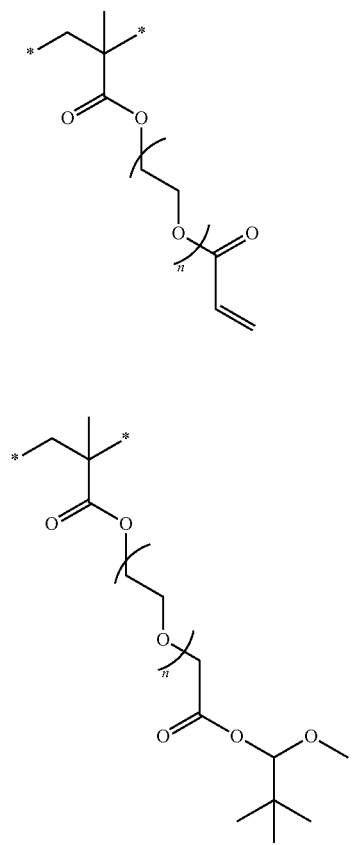
Resin A-7
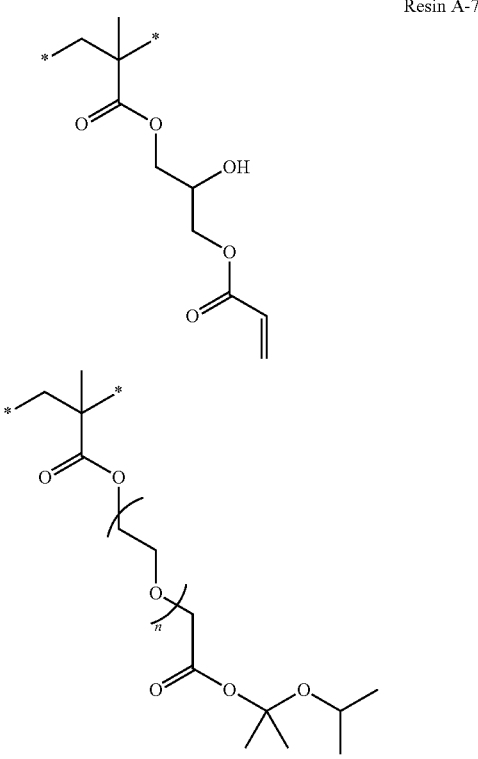
In the above resin A-5, n is 23.
In the above resin A-6, n of the left side repeating unit is 8, and n of the right side repeating unit is 8.
In the resin A-7, n is 90.
Resin A-8
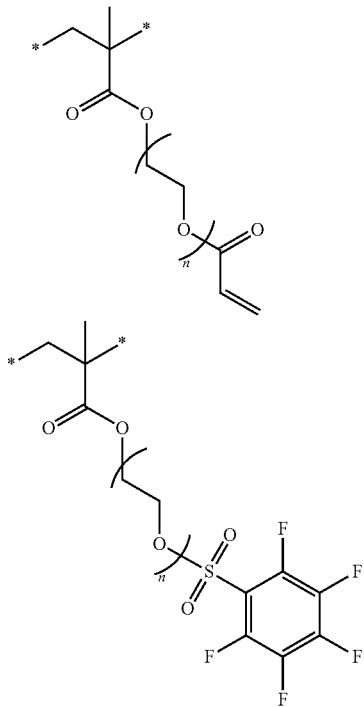

Resin A-9

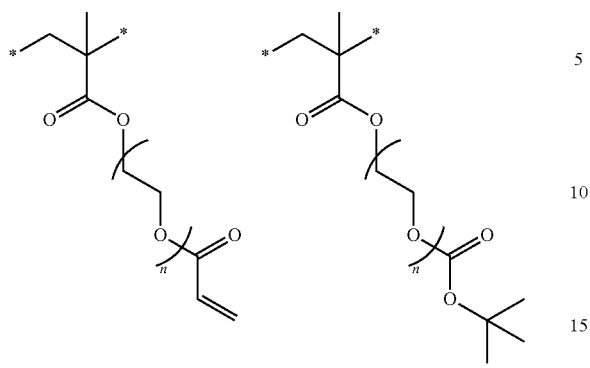

Resin A-12

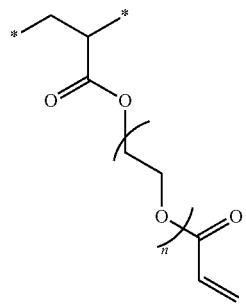

Resin A-10

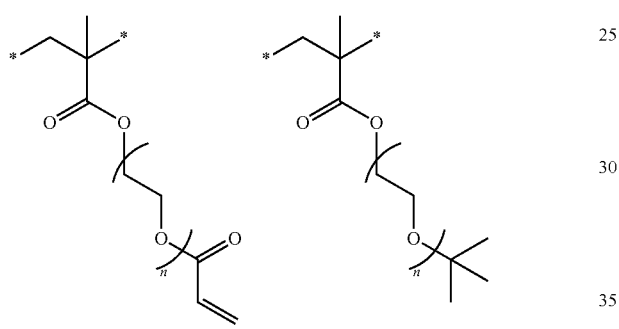

Resin A-11

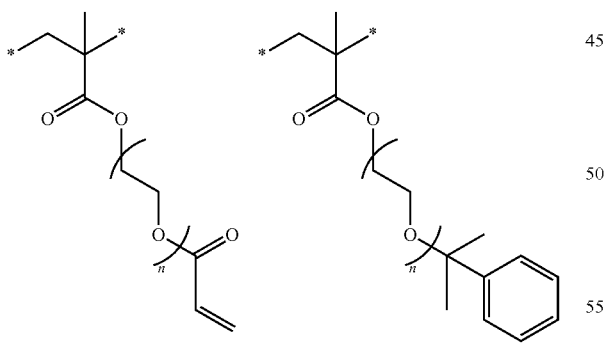

Resin A-13

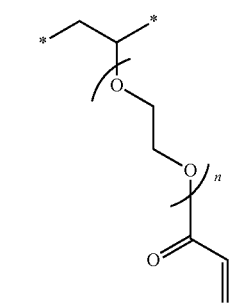

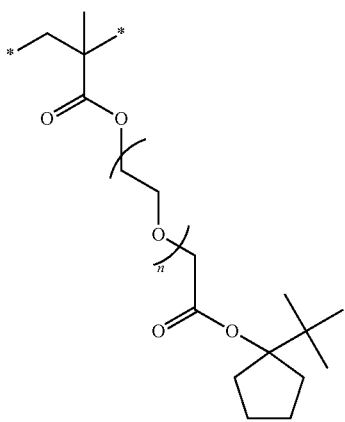

In the above resin A-8, n of the left side repeating unit is 8, and n of the right side repeating unit is 8.

In the above resin A-9, n of the left side repeating unit is 8, and n of the right side repeating unit is 8.

In the above resin A-10, n of the left side repeating unit is 8, and n of the right side repeating unit is 8.

In the above resin A-11, n of the left side repeating unit is 200, and n of the right side repeating unit is 200.

-continued
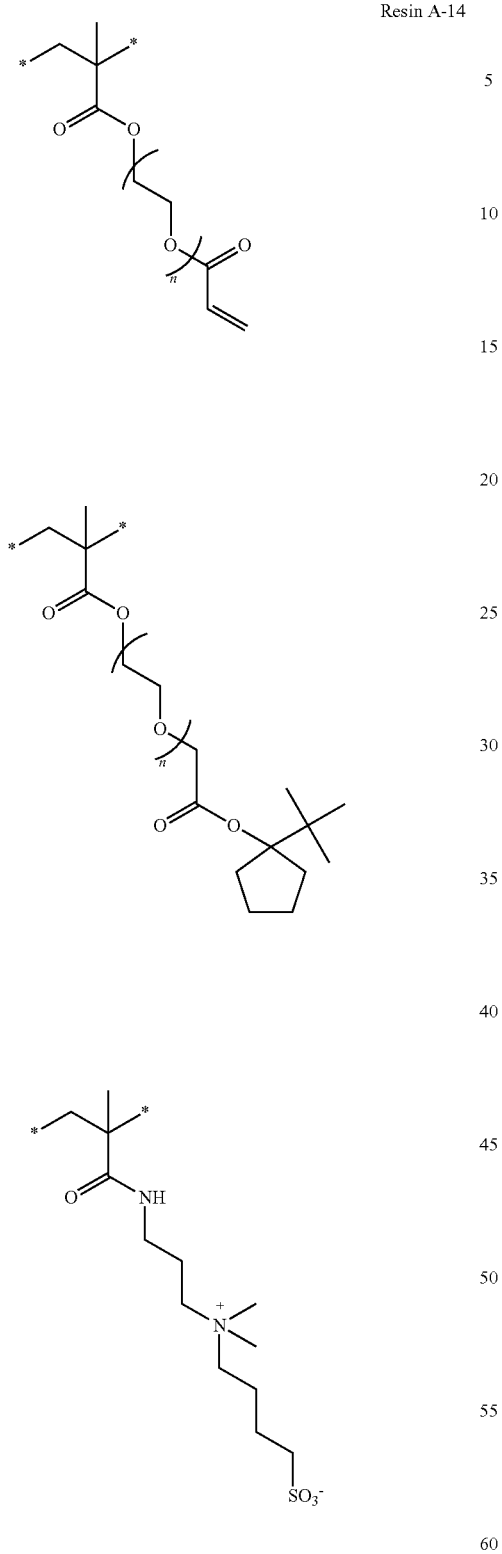
Resin A-14
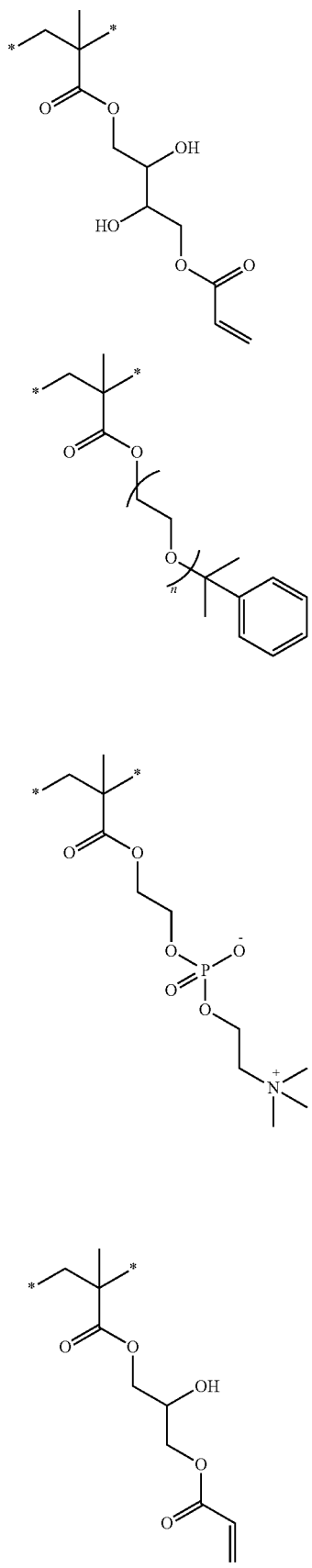
Resin A-15
Resin A-16
In the above resin A-12, n of the left side repeating unit is 4, and n of the right side repeating unit is 4.
In the above resin A-13, n of the left side repeating unit is 16, and n of the right side repeating unit is 16.
In the above resin A-14, n of the left side repeating unit is 23, and n of a middle repeating unit is 23.

-continued
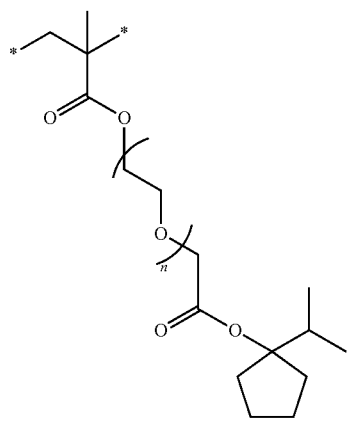
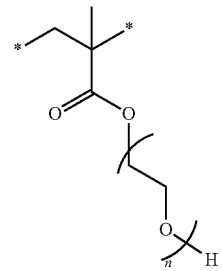
Resin A-17
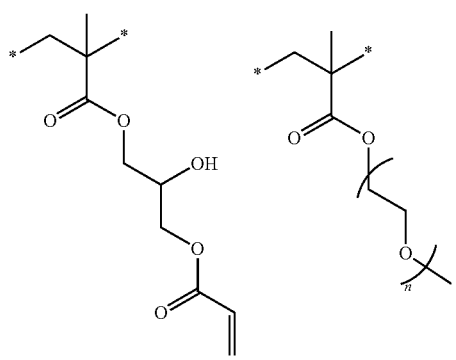
Resin A-18
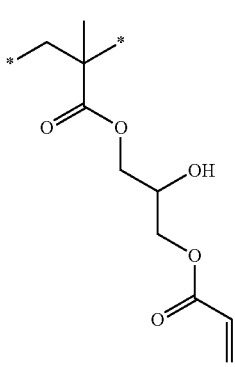
In the above resin A-15, n is 454.
In the above resin A-16, n of the middle repeating unit is 46, and n of the right side repeating unit is 46.
In the above resin A-17, n is 90.
Resin A-19
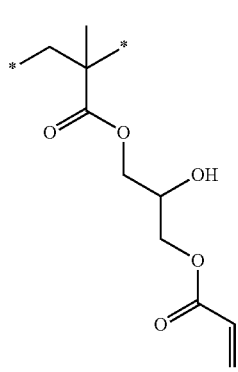
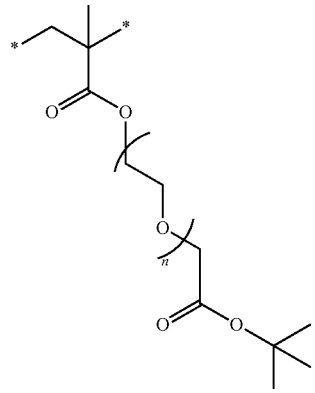
Resin H-3
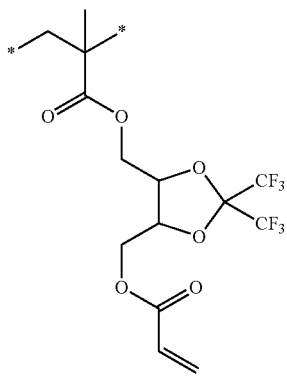
Resin H-4
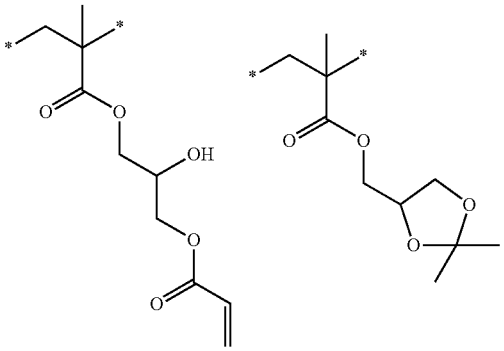

Resin A-22
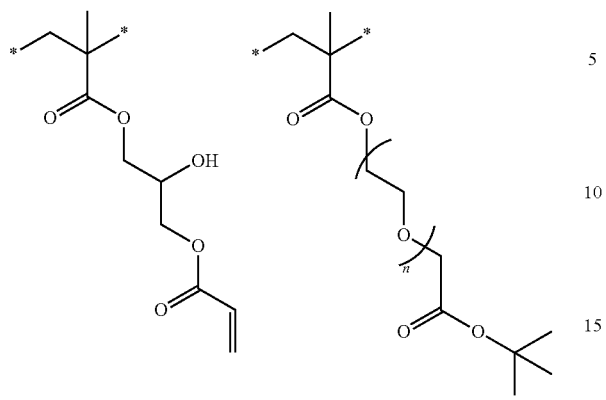
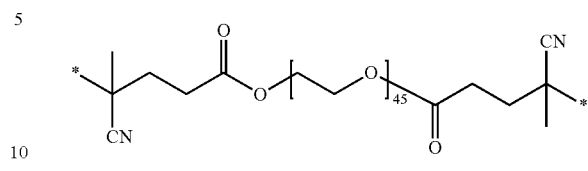
In the above resin A-19, n is 1. In the above resin A-22, n is 8.
Resin H-1
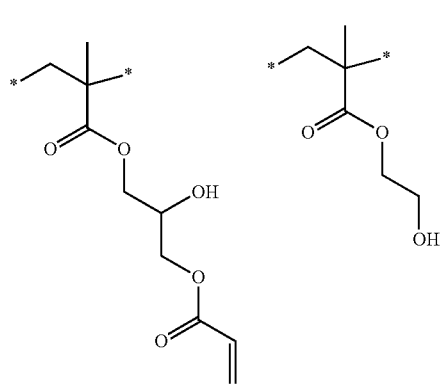
Resin H-2
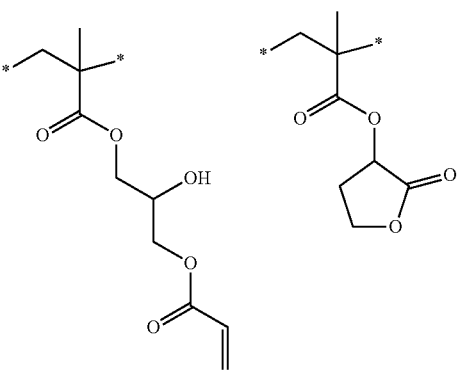
Resin A-23
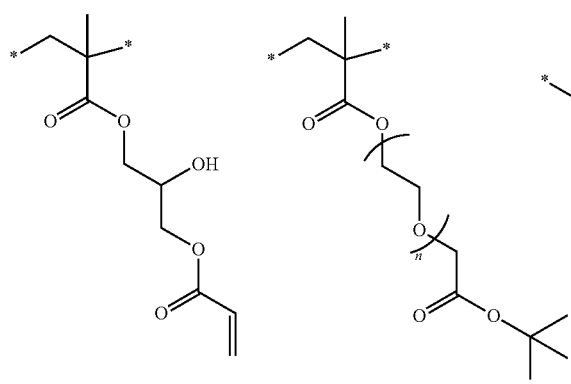
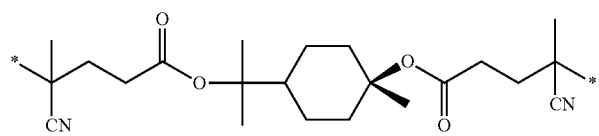
Resin A-24
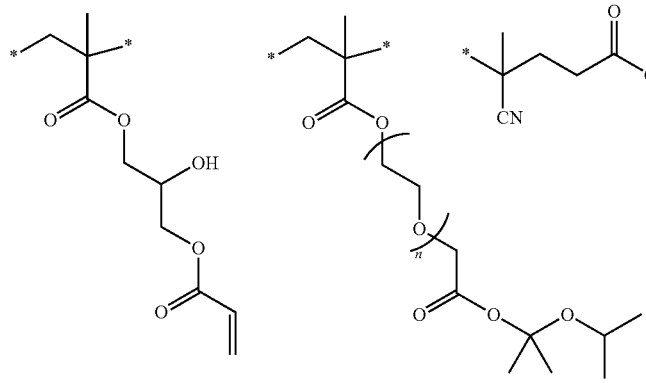
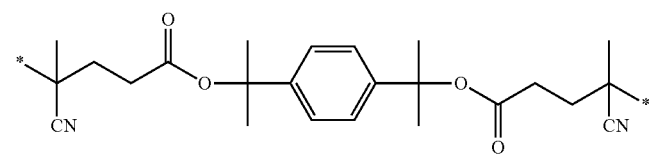

Resin A-25
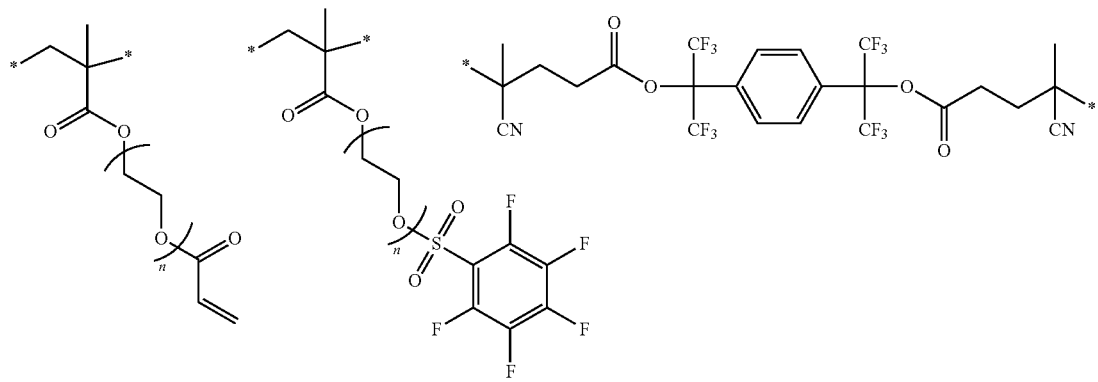
Resin A-26
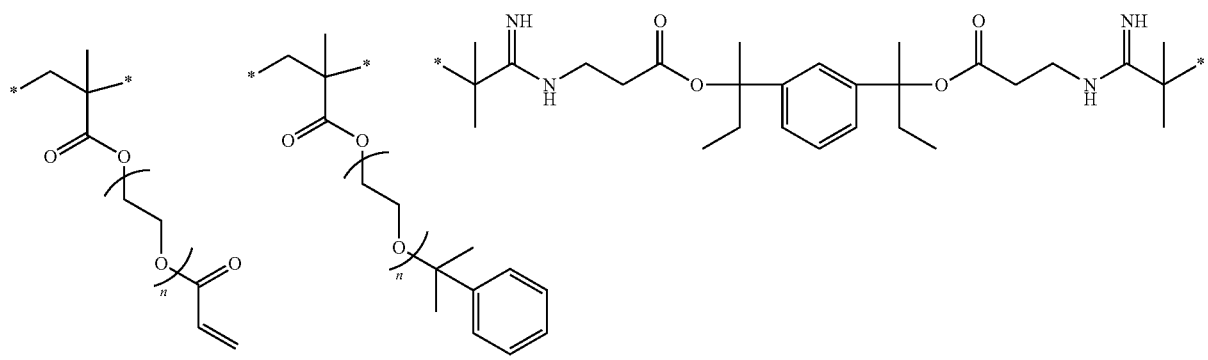
Resin A-27
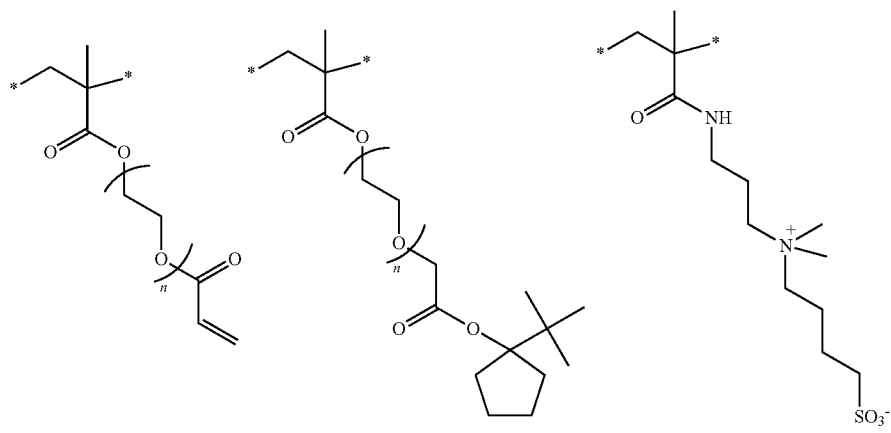
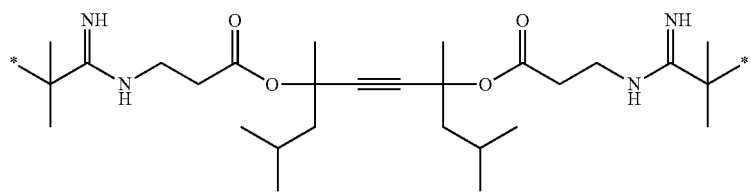

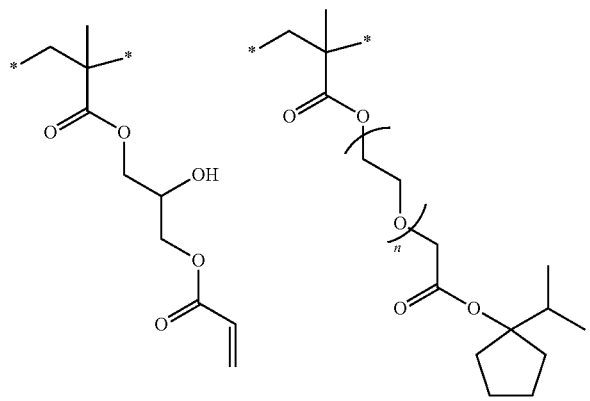

Resin A-28

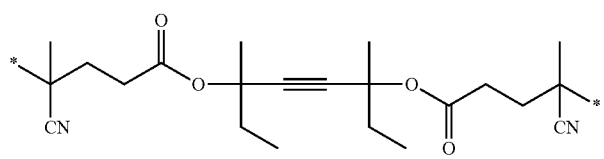

In the above resin A-23, n is 90.

In the above resin A-24, n is 23.

In the above resin A-25, n of the left side repeating unit is 8, and n of the right side repeating unit is 8.

In the above resin A-26, n of the left side repeating unit is 8, and n of the right side repeating unit is 8.

In the above resin A-27, n of the left side repeating unit is 46, and n of the middle repeating unit is 46.

In the above resin A-28, n of the left side repeating unit is 8, and n of the middle repeating unit is 8.

Resin A-29

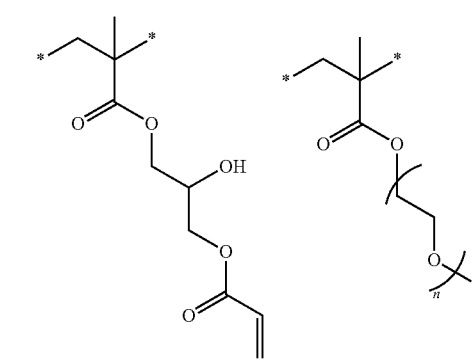

-continued

Resin A-30

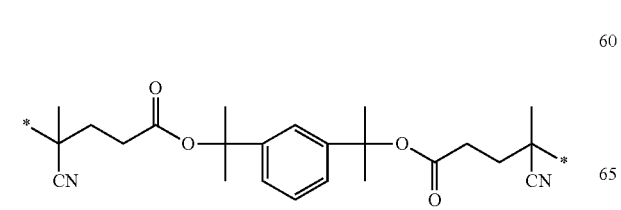

In the above resin A-29, n is 90.

<Other Raw Materials>

Additives B-1 to B-8 having the following structural formula

Additive B-1

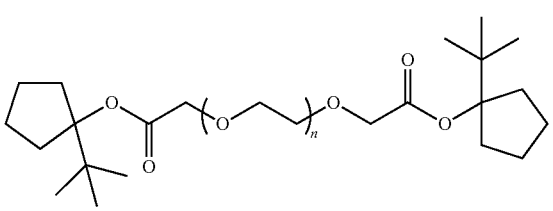

In the above additive B-1, n is 90.
In the above additive B-2, n is 200.
In the above additive B-3, n is 454.
In the above additive B-3, n is 454.

In the above additive B-4, n is 23.
In the above additive B-5, n is 46.

In the above additive B-6, n is 23.
In the above additive B-8, n is 80.

-continued

Additive B-11

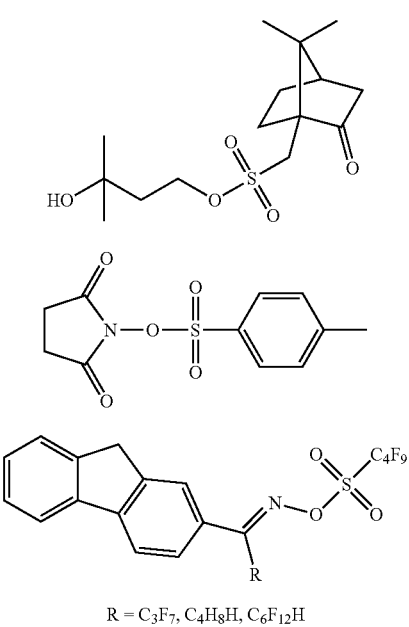

Additive B-12

Additive B-13

R = C₃F₇, C₄H₈H, C₆F₁₂H

<Solvent>
PGMEA: Propylene glycol monomethyl ether acetate
PGME: Propylene glycol monomethyl ether
<Compound Generated by Decomposition by Treatment of Polarity Conversion Group>

For each resin and each additive, a polarity conversion group was treated to decompose the compound having the polarity conversion group, and the generated compounds and their molecular weights are shown in Table 1-1 or Table 1-2.

In the present example, processing was performed under the following conditions.

10 mg of the resin or additive was heated from 30° C. to 180° C. at a rate of 5° C./min, and a temperature was maintained at 180° C. for 1 minute. The compounds generated at this time were identified using a TGA-GC-MS Coupling device manufactured by NETZSCH (device name: MS-GC-STA 449 FI Jupiter (registered trademark)).

In addition, for each resin, a C log P value of a monomer corresponding to a repeating unit obtained after subjecting the repeating unit having the polarity conversion group constituting the resin to the above-described treatment is shown in Table 1-1 or Table 1-2. The resins A-17, A-18, H-1, and H-2, and the additives B-7 to B-13 do not have the polarity conversion group.

The C log P value was calculated using SOFTWARE PACKAGE 2 (Chem Bio Draw Ultra Ver. 13.0.2.3021 (Cambridge Soft Corporation, USA)).

TABLE 1-1

| Type of resin | Compound generated by decomposition through treatment of polarity conversion group | | ClogP value |
|---|---|---|---|
| | Compound | Molecular weight | |
| Resin A-1 | (isobutylene) | 56.1 | Unable to calculate* |

TABLE 1-1-continued

| Type of resin | Compound generated by decomposition through treatment of polarity conversion group | | ClogP value |
|---|---|---|---|
| | Compound | Molecular weight | |
| Resin A-2 | (t-butyl cyclopentene) | 124.2 | Unable to calculate* |
| Resin A-3 | (isopropyl cyclopentene) | 110.2 | Unable to calculate* |
| Resin A-4 | (tris-CF₃ cyclopentene) | 300.1 | Unable to calculate* |
| Resin A-5 | CH₂O | 30.0 | −3.1 |
| Resin A-6 | MeOH | 32.0 | −0.5 |
| Resin A-7 | (isopropanol) | 60.1 | Unable to calculate* |
| Resin A-8 | (pentafluorophenyl sulfonic acid) | 248.1 | −0.5 |
| Resin A-9 | (isobutylene) | 56.1 | −0.5 |
| Resin A-10 | (isobutylene) | 56.1 | −0.5 |
| Resin A-11 | (styrene) | 104.2 | Unable to calculate* |
| Resin A-12 | (t-butyl cyclopentene) | 124.2 | 0.2 |
| Resin A-13 | (t-butyl cyclopentene) | 124.2 | −1.9 |

TABLE 1-1-continued

| Type of resin | Compound | Molecular weight | ClogP value |
|---|---|---|---|
| Resin A-14 | 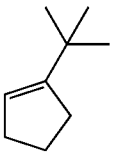 | 124.2 | −3.1 |

TABLE 1-2

| Type of resin | Compound | Molecular weight | ClogP value |
|---|---|---|---|
| Resin A-15 | (styrene) | 110.2 | Unable to calculate* |
| Resin A-16 | (isopropylcyclopentene) | 110.2 | −7.2 |
| Resin A-19 | (isobutylene) | 56.1 | 0.7 |
| Resin H-3 | F₃C-C(=O)-CF₃ | 166.0 | 0.0 |
| Resin H-4 | acetone | 58.1 | −0.5 |

TABLE 1-2-continued

| Type of resin | Compound | Molecular weight | ClogP value |
|---|---|---|---|
| Resin A-22 | (isobutylene) | 56.1 | 0.7 |
| Additive B-1 | (tert-butylcyclopentene) | 124.2 | Unable to calculate* |
| Additive B-2 | MeOH | 32.0 | Unable to calculate* |
| Additive B-3 | pentafluorobenzenesulfonic acid | 248.1 | Unable to calculate* |
| Additive B-4 | (isobutylene) | 56.1 | −5.0 |
| Additive B-5 | (styrene) | 110.2 | −9.0 |
| Additive B-6 | (isopropylcyclopentene) | 110.2 | −5.0 |

TABLE 1-3

| Type of resin | Compound | Molecular weight | ClogP value |
|---|---|---|---|
| Resin A-23 | (isobutylene) | 56.1 | Unable to calculate* |
| | (limonene-type) | 136.2 | |
| Resin A-24 | isopropanol (OH) | 60.1 | −3.1 |

TABLE 1-3-continued
| Type of resin | Compound | Molecular weight | ClogP value |
|---|---|---|---|
| | 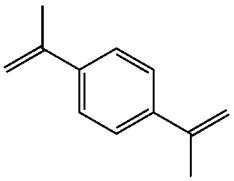 | 158.2 | |
| Resin A-25 | 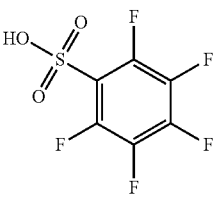 [SMILES: O=S(=O)(O)c1c(F)c(F)c(F)c(F)c1F] | 248.1 | −0.5 |
| | 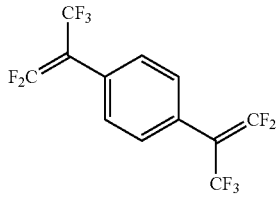 | 338.2 | |
| Resin A-26 | 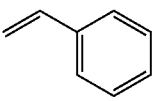 | 110.2 | −0.5 |
| | 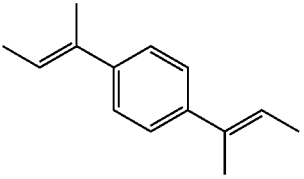 | 186.3 | |
| Resin A-27 | 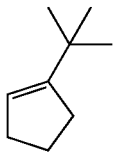 | 124.2 | −7.2 |
| | 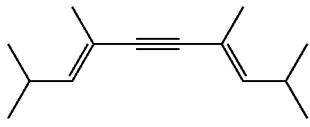 | 190.3 | |
| Resin A-28 | 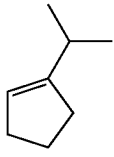 | 110.2 | −0.5 |
| | 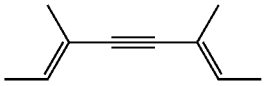 | 134.2 | |

TABLE 1-3-continued

| | Compound generated by decomposition through treatment of polarity conversion group | | |
|---|---|---|---|
| Type of resin | Compound | Molecular weight | ClogPvalue |
| Resin A-29 | [structure: 1,4-bis(isopropenyl)benzene] | 158.2 | 0.1 |
| Resin A-30 | [structure: CH₂=C(CH₃)-CH₂CH₂-C(CH₃)=CH₂] | 110.2 | 0.1 |

In Tables 1-1 to 1-3, MeOH represents methanol.

<Weight-Average Molecular Weight of Resin>

The weight-average molecular weight was measured under the following conditions.

1. Column
Manufactured by TOSOH CORPORATION
TSK guard column MP (XL) (# M0019)
TSK gel Multipore Hxl-M (# M0072)
TSK gel Multipore Hxl-M (# M0071)
TSK gel Multipore Hxl-M (# M0070)
2. Temperature: 40° C.
3. Development solvent and concentration: 100% Tetrahydrofuran (THF)
4. Flow rate of development solvent
Sample pump: 1.00 mL/minute
Reference pump: 0.33 mL/minute
5. Detector: infrared rays (RI)
<Measurement Conditions>
Recorder range: 256 uRIU
Recorder balance: 0%
Polarity: positive (+)
Intensity balance: 0%
Intensity range: 256 uRIU
Response: 0.5 seconds
Temperature: 40° C.
6. Injection amount: 10 μL
7. Device: HLC-8320 GPC manufactured by TOSOH CORPORATION
8. Sample diluent: Tetrahydrofuran (THF)
9. Sample concentration: 0.5 mass %
10. Calibration curve base resin: TSK standard POLYSTYRENE Mol. Wt.; 1,090,000, 355,000, 186,000, 96,400, 37,900, 16,700, 10,200, 5,570, 2,630, 1,010, 590, 580, 578, 474, and 370 manufactured by TOSOH CORPORATION <Preparation of Composition for Forming Adhesive Film for Imprinting>

As described in Tables 2 to 5, components are blended with each other and filtered with a polytetrafluoroethylene (PTFE) filter having a pore diameter of 0.1 μm to prepare each composition for forming an adhesive film for imprinting shown in examples and comparative examples.

TABLE 2

| | Weight-average molecular weight | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Resin A-1 (parts by mass) | 30000 | 10.0 | | | | | | | | | |
| Resin A-2 (parts by mass) | 50000 | | 10.0 | | | | | | | | |
| Resin A-3 (parts by mass) | 20000 | | | 10.0 | | | | | | | |
| Resin A-4 (parts by mass) | 20000 | | | | 10.0 | | | | | | |
| Resin A-5 (parts by mass) | 15000 | | | | | 10.0 | | | | | |
| Resin A-6 (parts by mass) | 15000 | | | | | | 10.0 | | | | |
| Resin A-7 (parts by mass) | 12000 | | | | | | | 10.0 | | | |
| Resin A-8 (parts by mass) | 8000 | | | | | | | | 10.0 | | |
| Resin A-9 (parts by mass) | 7000 | | | | | | | | | 10.0 | |
| Resin A-10 (parts by mass) | 20000 | | | | | | | | | | 10.0 |
| Resin A-11 (parts by mass) | 15000 | | | | | | | | | | |
| Resin A-12 (parts by mass) | 9000 | | | | | | | | | | |
| Resin A-13 (parts by mass) | 10000 | | | | | | | | | | |
| Resin A-14 (parts by mass) | 50000 | | | | | | | | | | |
| Resin A-15 (parts by mass) | 60000 | | | | | | | | | | |
| Resin A-16 (parts by mass) | 20000 | | | | | | | | | | |
| Resin A-17 (parts by mass) | 10000 | | | | | | | | | | |
| Resin A-18 (parts by mass) | 20000 | | | | | | | | | | |
| Resin A-19 (parts by mass) | 60000 | | | | | | | | | | |
| Resin H-3 (parts by mass) | 40000 | | | | | | | | | | |
| Resin H-4 (parts by mass) | 35000 | | | | | | | | | | |
| Resin A-22 (parts by mass) | 60000 | | | | | | | | | | |
| Resin A-23 (parts by mass) | 25000 | | | | | | | | | | |
| Resin A-24 (parts by mass) | 20000 | | | | | | | | | | |
| Resin A-25 (parts by mass) | 10000 | | | | | | | | | | |

TABLE 2-continued

| | Weight-average molecular weight | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Resin A-26 (parts by mass) | 15000 | | | | | | | | | | |
| Resin A-27 (parts by mass) | 30000 | | | | | | | | | | |
| Resin A-28 (parts by mass) | 20000 | | | | | | | | | | |
| Resin A-29 (parts by mass) | 15000 | | | | | | | | | | |
| Resin A-30 (parts by mass) | 9000 | | | | | | | | | | |
| Additive B-1 (parts by mass) | — | | | | | | | | | | |
| Additive B-2 (parts by mass) | — | | | | | | | | | | |
| Additive B-3 (parts by mass) | — | | | | | | | | | | |
| Additive B-4 (parts by mass) | — | | | | | | | | | | |
| Additive B-5 (parts by mass) | — | | | | | | | | | | |
| Additive B-6 (parts by mass) | — | | | | | | | | | | |
| Additive B-7 (parts by mass) | — | | | | | | | | | | |
| Additive B-8 (parts by mass) | — | | | | | | | | | | |
| Additive B-9 (parts by mass) | — | | | | | | | | | | |
| Additive B-10 (parts by mass) | — | | | | | | | | | | |
| Additive B-11 (parts by mass) | — | | | | | | | | | | |
| Additive B-12 (parts by mass) | — | | | | | | | | | | |
| Additive B-13 (parts by mass) | — | | | | | | | | | | |
| Resin H-1 | 30000 | | | | | | | | | | |
| Resin H-2 | 20000 | | | | | | | | | | |
| PGMEA (parts by mass) | — | 45.0 | 90.0 | 90.0 | 90.0 | 90.0 | 90.0 | 90.0 | 90.0 | 90.0 | 90.0 |
| PGME (parts by mass) | — | 45.0 | | | | | | | | | |

TABLE 3

| | Weight-average molecular weight | Example 11 | Example 12 | Example 13 | Example 14 | Example 15 | Example 16 | Example 17 | Comparative Example 3 | Example 19 | Example 20 |
|---|---|---|---|---|---|---|---|---|---|---|---|
| Resin A-1 (parts by mass) | 30000 | | | | | | | 4.0 | | | |
| Resin A-2 (parts by mass) | 50000 | | | | | | | | | 3.0 | |
| Resin A-3 (parts by mass) | 20000 | | | | | | | | | | |
| Resin A-4 (parts by mass) | 20000 | | | | | | | | | | |
| Resin A-5 (parts by mass) | 15000 | | | | | | | | | | |
| Resin A-6 (parts by mass) | 15000 | | | | | | | | | | |
| Resin A-7 (parts by mass) | 12000 | | | | | | | | | | |
| Resin A-8 (parts by mass) | 8000 | | | | | | | | | | |
| Resin A-9 (parts by mass) | 7000 | | | | | | | | | | |
| Resin A-10 (parts by mass) | 20000 | | | | | | | | | | |
| Resin A-11 (parts by mass) | 15000 | 10.0 | | | | | | | | | |
| Resin A-12 (parts by mass) | 9000 | | 5.0 | | | | | | | | |
| Resin A-13 (parts by mass) | 10000 | | | 10.0 | | | | | | | |
| Resin A-14 (parts by mass) | 50000 | | | | 10.0 | | | | | | |
| Resin A-15 (parts by mass) | 60000 | | | | | 10.0 | | | | | |
| Resin A-16 (parts by mass) | 20000 | | | | | | 10.0 | | | | |
| Resin A-17 (parts by mass) | 10000 | | | | | | | | | | 9.0 |
| Resin A-18 (parts by mass) | 20000 | | | | | | | | | | |
| Resin A-19 (parts by mass) | 60000 | | | | | | | | 5.0 | | |
| Resin H-3 (parts by mass) | 40000 | | | | | | | | 10.0 | | |
| Resin H-4 (parts by mass) | 35000 | | | | | | | | | 5.0 | |
| Resin A-22 (parts by mass) | 60000 | | 5.0 | | | | | | | | |
| Resin A-23 (parts by mass) | 25000 | | | | | | | | | | |
| Resin A-24 (parts by mass) | 20000 | | | | | | | | | | |
| Resin A-25 (parts by mass) | 10000 | | | | | | | | | | |
| Resin A-26 (parts by mass) | 15000 | | | | | | | | | | |
| Resin A-27 (parts by mass) | 30000 | | | | | | | | | | |
| Resin A-28 (parts by mass) | 20000 | | | | | | | | | | |
| Resin A-29 (parts by mass) | 15000 | | | | | | | | | | |
| Resin A-30 (parts by mass) | 9000 | | | | | | | | | | |
| Additive B-1 (parts by mass) | — | | | | | | | 1.0 | | 1.0 | 1.0 |
| Additive B-2 (parts by mass) | — | | | | | | | | | | |
| Additive B-3 (parts by mass) | — | | | | | | | | | 1.0 | |
| Additive B-4 (parts by mass) | — | | | | | | | | | | |
| Additive B-5 (parts by mass) | — | | | | | | | | | | |
| Additive B-6 (parts by mass) | — | | | | | | | | | | |

TABLE 3-continued

|  | Weight-average molecular weight | Example 11 | Example 12 | Example 13 | Example 14 | Example 15 | Example 16 | Example 17 | Comparative Example 3 | Example 19 | Example 20 |
|---|---|---|---|---|---|---|---|---|---|---|---|
| Additive B-7 (parts by mass) | — | | | | | | | | | | |
| Additive B-8 (parts by mass) | — | | | | | | | | | | |
| Additive B-9 (parts by mass) | — | | | | | | | | | | |
| Additive B-10 (parts by mass) | — | | | | | | | | | | |
| Additive B-11 (parts by mass) | — | | | | | | | | | | |
| Additive B-12 (parts by mass) | — | | | | | | | | | | |
| Additive B-13 (parts by mass) | — | | | | | | | | | | |
| Resin H-1 | 30000 | | | | | | | | | | |
| Resin H-2 | 20000 | | | | | | | | | | |
| PGMEA (parts by mass) | — | 90.0 | 90.0 | 90.0 | 90.0 | 90.0 | 90.0 | 90.0 | 90.0 | 90.0 | 90.0 |
| PGME (parts by mass) | — | | | | | | | | | | |

TABLE 4

|  | Weight-average molecular weight | Example 21 | Example 22 | Example 23 | Example 24 | Example 25 | Example 26 | Example 27 | Example 28 | Example 29 | Example 30 |
|---|---|---|---|---|---|---|---|---|---|---|---|
| Resin A-1 (parts by mass) | 30000 | | | | | | | | | | |
| Resin A-2 (parts by mass) | 50000 | | | | | 9.0 | | | | | |
| Resin A-3 (parts by mass) | 20000 | | | | | | | | | | |
| Resin A-4 (parts by mass) | 20000 | | 9.0 | | | | | | | | |
| Resin A-5 (parts by mass) | 15000 | | | 9.0 | | | | | | | |
| Resin A-6 (parts by mass) | 15000 | | | | | | | | | | |
| Resin A-7 (parts by mass) | 12000 | | | | | | | | | | |
| Resin A-8 (parts by mass) | 8000 | | | | | | | | | | |
| Resin A-9 (parts by mass) | 7000 | | | | | | | | | | |
| Resin A-10 (parts by mass) | 20000 | | | | 9.0 | | 9.0 | | | | |
| Resin A-11 (parts by mass) | 15000 | | | | | | | | 9.9 | 9.99 | 9.78 |
| Resin A-12 (parts by mass) | 9000 | | | | | | | | | | |
| Resin A-13 (parts by mass) | 10000 | | | | | | | 9.0 | | | |
| Resin A-14 (parts by mass) | 50000 | | | | | | | | | | |
| Resin A-15 (parts by mass) | 60000 | | | | | | | | | | |
| Resin A-16 (parts by mass) | 20000 | | | | | | | | | | |
| Resin A-17 (parts by mass) | 10000 | | | | | | | | | | |
| Resin A-18 (parts by mass) | 20000 | 9.0 | | | | | | | | | |
| Resin A-19 (parts by mass) | 60000 | | | | | | | | | | |
| Resin H-3 (parts by mass) | 40000 | | | | | | | | | | |
| Resin H-4 (parts by mass) | 35000 | | | | | | | | | | |
| Resin A-22 (parts by mass) | 60000 | | | | | | | | | | |
| Resin A-23 (parts by mass) | 25000 | | | | | | | | | | |
| Resin A-24 (parts by mass) | 20000 | | | | | | | | | | |
| Resin A-25 (parts by mass) | 10000 | | | | | | | | | | |
| Resin A-26 (parts by mass) | 15000 | | | | | | | | | | |
| Resin A-27 (parts by mass) | 30000 | | | | | | | | | | |
| Resin A-28 (parts by mass) | 20000 | | | | | | | | | | |
| Resin A-29 (parts by mass) | 15000 | | | | | | | | | | |
| Resin A-30 (parts by mass) | 9000 | | | | | | | | | | |
| Additive B-1 (parts by mass) | — | | | | | | | | | | |
| Additive B-2 (parts by mass) | — | | 1.0 | | | | | | | | |
| Additive B-3 (parts by mass) | — | | | 1.0 | | | | | | | |
| Additive B-4 (parts by mass) | — | | | | 1.0 | | | | | | |
| Additive B-5 (parts by mass) | — | | | | | 1.0 | | | | | |
| Additive B-6 (parts by mass) | — | | | | | | 1.0 | | | | |
| Additive B-7 (parts by mass) | — | | | | | | | 1.0 | 0.5 | | |
| Additive B-8 (parts by mass) | — | | | | | | | | 0.5 | | |

TABLE 4-continued

|  | Weight-average molecular weight | Example 21 | Example 22 | Example 23 | Example 24 | Example 25 | Example 26 | Example 27 | Example 28 | Example 29 | Example 30 |
|---|---|---|---|---|---|---|---|---|---|---|---|
| Additive B-9 (parts by mass) | — |  |  |  |  |  |  |  | 0.1 | 0.01 | 0.1 |
| Additive B-10 (parts by mass) | — |  |  |  |  |  |  |  |  |  |  |
| Additive B-11 (parts by mass) | — |  |  |  |  |  |  |  |  |  | 0.01 |
| Additive B-12 (parts by mass) | — |  |  |  |  |  |  |  |  |  | 0.1 |
| Additive B-13 (parts by mass) | — |  |  |  |  |  |  |  |  |  |  |
| Resin H-1 | 30000 |  |  |  |  |  |  |  |  |  |  |
| Resin H-2 | 20000 |  |  |  |  |  |  |  |  |  |  |
| PGMEA (parts by mass) | — | 90.0 | 90.0 | 90.0 | 50.0 | 90.0 | 90.0 | 90.0 | 90.0 | 90.0 | 90.0 |
| PGME (parts by mass) | — |  |  |  | 40.0 |  |  |  |  |  |  |

TABLE 5

|  | Weight-average molecular weight | Example 31 | Example 32 | Example 33 | Example 34 | Example 35 | Comparative Example 1 | Comparative Example 2 | Example 36 | Example 37 | Example 38 | Example 39 | Example 40 | Example 41 | Example 42 | Example 43 |
|---|---|---|---|---|---|---|---|---|---|---|---|---|---|---|---|---|
| Resin A-1 (parts by mass) | 30000 |  |  | 9.0 |  |  |  |  |  |  |  |  |  |  |  |  |
| Resin A-2 (parts by mass) | 50000 |  |  |  |  |  |  |  |  |  |  |  |  |  |  |  |
| Resin A-3 (parts by mass) | 20000 |  |  |  |  |  |  |  |  |  |  |  |  |  |  |  |
| Resin A-4 (parts by mass) | 20000 |  |  |  |  |  |  |  |  |  |  |  |  |  |  |  |
| Resin A-5 (parts by mass) | 15000 |  |  |  |  |  |  |  |  |  |  |  |  | 5.0 |  |  |
| Resin A-6 (parts by mass) | 15000 | 9.9 | 9.99 | 9.89 |  |  |  |  |  |  |  |  |  |  |  |  |
| Resin A-7 (parts by mass) | 12000 |  |  |  |  |  |  |  |  |  |  |  |  |  |  |  |
| Resin A-8 (parts by mass) | 8000 |  |  |  |  |  |  |  |  |  |  |  |  |  |  |  |
| Resin A-9 (parts by mass) | 7000 |  |  |  |  |  |  |  |  |  |  |  |  |  |  |  |
| Resin A-10 (parts by mass) | 20000 |  |  |  |  |  |  |  |  |  |  |  |  |  |  |  |
| Resin A-11 (parts by mass) | 15000 |  |  |  |  |  |  |  |  |  |  |  |  |  |  |  |
| Resin A-12 (parts by mass) | 9000 |  |  |  |  |  |  |  |  |  |  |  |  |  |  |  |
| Resin A-13 (parts by mass) | 10000 |  |  |  |  |  |  |  |  |  |  |  |  |  |  |  |
| Resin A-14 (parts by mass) | 50000 |  |  |  |  |  |  |  |  |  |  |  |  |  |  |  |
| Resin A-15 (parts by mass) | 60000 |  |  |  |  |  |  |  |  |  |  |  |  |  |  |  |
| Resin A-16 (parts by mass) | 20000 |  |  |  |  |  |  |  |  |  |  |  |  |  |  |  |
| Resin A-17 (parts by mass) | 10000 |  |  |  |  |  |  |  |  |  |  |  |  |  |  |  |
| Resin A-18 (parts by mass) | 20000 |  |  |  |  |  |  |  |  |  |  |  |  |  |  |  |
| Resin A-19 (parts by mass) | 60000 |  |  |  |  |  |  |  |  |  |  |  |  |  |  |  |
| Resin H-3 (parts by mass) | 40000 |  |  |  |  |  |  |  |  |  |  |  |  |  |  |  |
| Resin H-4 (parts by mass) | 35000 |  |  |  |  |  |  |  |  |  |  |  |  |  |  |  |
| Resin A-22 (parts by mass) | 60000 |  |  |  |  |  |  |  |  |  |  |  |  |  |  |  |
| Resin A-23 (parts by mass) | 25000 |  |  |  |  |  |  | 10 |  |  |  |  |  |  |  |  |
| Resin A-24 (parts by mass) | 20000 |  |  |  |  |  |  |  | 10 |  |  |  |  |  |  |  |

TABLE 5-continued

| | Weight-average molecular weight | Example 31 | Example 32 | Example 33 | Example 34 | Example 35 | Comparative Example 1 | Comparative Example 2 | Example 36 | Example 37 | Example 38 | Example 39 | Example 40 | Example 41 | Example 42 | Example 43 |
|---|---|---|---|---|---|---|---|---|---|---|---|---|---|---|---|---|
| Resin A-25 (parts by mass) | 10000 | | | | | | | | | 10 | | | | | | |
| Resin A-26 (parts by mass) | 15000 | | | | | | | | | | 8 | | | | | |
| Resin A-27 (parts by mass) | 30000 | | | | | | | | | | | | 10 | | | |
| Resin A-28 (parts by mass) | 20000 | | | | | | | | | | | | | 5 | | |
| Resin A-29 (parts by mass) | 15000 | | | | | | | | | | | | | | 10 | |
| Resin A-30 (parts by mass) | 9000 | | | | | | | | | | | | | | | 10 |
| Additive B-1 (parts by mass) | — | | | | | 1.0 | | | | | | | | | | |
| Additive B-2 (parts by mass) | — | | | | | | | | | | | | | | | |
| Additive B-3 (parts by mass) | — | | | | | | | | | | | | | | | |
| Additive B-4 (parts by mass) | — | | | | | | | | | | | | | | | |
| Additive B-5 (parts by mass) | — | | | | | | | | | | | | | | | |
| Additive B-6 (parts by mass) | — | | | | | | | | | | | | | | | |
| Additive B-7 (parts by mass) | — | | | | | | | | | | | 2 | | | | |
| Additive B-8 (parts by mass) | — | | | | | | | | | | | | | | | |
| Additive B-9 (parts by mass) | — | | | | | | | | | | | | | | | |
| Additive B-10 (parts by mass) | — | 0.1 | 0.01 | 0.1 | | | | | | | | | | | | |
| Additive B-11 (parts by mass) | — | | | 0.01 | | | | | | | | | | | | |
| Additive B-12 (parts by mass) | — | | | | | | | | | | | | | | | |
| Additive B-13 (parts by mass) | — | 0.1 | | | | | | | | | | | | | | |
| Resin H-1 | 30000 | | | | 1.0 | 9.0 | 10.0 | | | | | | | | | |
| Resin H-2 | 20000 | | | | | | | 10.0 | | | | | | | | |
| PGMEA (parts by mass) | — | 90.0 | 90.0 | 90.0 | 90.0 | 90.0 | 90.0 | 90.0 | 90.0 | 90.0 | 90.0 | 90.0 | 90.0 | 90.0 | 90.0 | 90.0 |
| PGME (parts by mass) | — | | | | | | | | | | | | | | | |

The weight-average molecular weight in Tables 2 to 5 represents a weight-average molecular weight of each resin.

<Preparation of Curable Composition for Imprinting V1>

48 parts by mass of LIGHT ACRYLATE NP-A (neopentyl glycol diacrylate manufactured by KYOEISHA CHEMICAL Co., LTD.), 48 parts by mass of a following compound M-3, 2 parts by mass of Light ACRYLATE L-A (lauryl acrylate manufactured by KYOEISHA CHEMICAL Co., LTD.), and 2 parts by mass of IRGACURE 907 (manufactured by BASF SE) were mixed with each other as polymerizable compounds, and 4-hydroxy-2,2,6,6-tetramethylpiperidine-1-oxyl free radical (manufactured by Tokyo Chemical Industry Co., Ltd.) was added thereto as a polymerization inhibitor so as to become 200 mass ppm (0.02 mass %) with respect to the polymerizable compounds to prepare a mixture. The mixture was filtered with a 0.1 μm filter made of polytetrafluoroethylene (PTFE) to prepare a curable composition for imprinting V1.

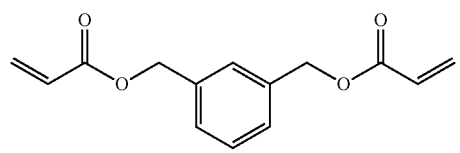

M-3

<Critical Surface Tension A>

A critical surface tension A (a critical surface tension of a film in which the polarity conversion group is not decomposed) of a film formed from the components excluding the solvent from the composition was measured according to the following method.

The composition for forming an adhesive film was spin-coated on a 100 nm-thick SOC (Spun On Carbon) and heated at 100° C. for 1 minute using a hot plate, and thereby a 5 nm-thick film was formed.

The critical surface tension of the obtained film was measured. The unit is shown as mN/m or more.

2 μL of each solvent having different surface tensions was added dropwise to the surface of the film, and each contact angle θ at a point in time of 500 msec was measured after droplet impact. Results of the contact angles (θ) being greater than or equal to 2° were plotted on an xy plane (x: surface tension of solvent, y: cos θ calculated from the contact angle θ), linear functions approximating the above-described measurement results were calculated by a least-squares method, and extrapolation values of the above-described linear functions at cos θ being 1 were set as a critical surface tension (unit: mN/m) of the film.

Water (surface tension of 72.9 mN/m), glycerin (63.2), formamide (58.5), ethylene glycol (50.2), γ-butyrolactone (30.1), oleic acid (32.2), cyclohexanone (34.1), methyl acetate (25.0) were used as solvents.

The measurement of contact angles was performed at 25° C. using DMs-401 manufactured by Kyowa Interface Science Co., Ltd. Values after 500 msec after droplet impact were measured using n=3, and an average value thereof was set as a contact angle.

<Critical Surface Tension B>

A critical surface tension B of a cured film of the composition (a critical surface tension of the adhesive film) was measured according to the following method.

For Examples 1 to 17, 19 to 25, 34 to 43, and Comparative Examples 1 to 3, the composition for forming an adhesive film was spin-coated on a substrate, heated for 1 minute using a hot plate at 100° C., and further heated for 1 minute using a hot plate at 180° C. to form an adhesive film with a thickness of 5 nm. For Examples 28 to 33, the composition for forming an adhesive film was spin-coated on a 100 nm-thick SOC, heated at 100° C. for 1 minute using a hot plate. Furthermore, the entire surface of the film was irradiated with ultraviolet rays using a high-pressure mercury lamp so that an exposure amount was 1,000 mJ/cm$^2$, and by heating on a hot plate at 180° C. for 1 minute, an adhesion film having a thickness of 5 nm was formed. For Examples 26 and 27, the composition for forming an adhesive film was spin-coated on a 100 nm-thick SOC, heated at 100° C. for 1 minute using a hot plate. Furthermore, an acidic aqueous solution of pH 1 was paddled, left stand for 30 seconds, and rinsed with pure water. Thereafter, after rotating a wafer for 30 seconds at 4000 rpm, by heating at 180° C. for 1 minute, an adhesive film having a thickness of 5 nm was formed.

A critical surface tension B of the obtained adhesive film was measured in the same manner as described above. The unit is shown as mN/m or more.

<Film Surface Condition>

The film surface condition of an adhesive film was evaluated as follows.

A 10 μm angle of the adhesive film obtained above was scanned using an atomic force microscope (AFM manufactured by Bruker AXS, Dimension Icon), and the arithmetic mean surface roughness (Ra) was measured. The results are shown in the following table.

A: Ra<0.4 nm
B: 0.4 nm≤Ra

<Change in Film Thickness>

The change in film thickness of the adhesive film was evaluated as follows.

The film thickness of the adhesive film obtained above was measured immediately after the production and after the lapse of 2 weeks at 25° C. using a reflective spectroscopic film thickness meter FE-3000 manufactured by OTSUKA ELECTRONICS Co., LTD.), and a difference (Δt) thereof was evaluated as follows. The results are shown in the following table.

A: Δt≤0.3 nm
B: 0.3 nm<Δt

<Adhesion Force>

The adhesion force between the substrate and the adhesive film was evaluated as follows.

Each of the surface of a spun-on carbon (SOC) film formed on a silicon wafer and the surface of a quartz wafer was spin-coated with the above-described composition for forming an adhesive film which was then heated for 1 minute on a hot plate fat 100° C. to dry the solvent.

For Examples 1 to 17, 19 to 25, and 34 to 43, and Comparative Examples 1 to 3, the composition for forming an adhesive film was hardened by further heating for 1 minute on a hot plate at 180° C. to form an adhesive film. The thickness of the adhesive film after hardening was 5 nm.

For Examples 28 to 33, the entire surface of the film was irradiated with ultraviolet rays using a high-pressure mercury lamp so that an exposure amount was 1,000 mJ/cm$^2$, and by heating on a hot plate at 180° C. for 1 minute, an adhesion film having a thickness of 5 nm was formed.

For Examples 26 and 27, an acidic aqueous solution of pH 1 was paddled, left stand for 30 seconds, and rinsed with pure water. Thereafter, after rotating a wafer for 30 seconds at 4000 rpm, by heating at 180° C. for 1 minute, an adhesive film having a thickness of 5 nm was formed.

A curable composition for imprinting V1 of which the temperature was adjusted to 25° C. was discharged on the surface of the adhesive film provided on the silicon wafer at an amount of liquid droplet of 1 μL per nozzle using an inkjet printer DMP-2831 manufactured by Fujifilm Dimatix, to coat the surface of the adhesive film so that liquid droplets are squarely arrayed at an interval of about 100 μm.

The quartz wafer was placed from the top so that the adhesive film side comes into contact with the curable composition for imprinting of the silicon wafer, and exposure was performed from the quartz wafer using a high pressure mercury lamp under the condition of 300 mJ/cm$^2$. After the exposure, the quartz wafer was released, and the peeling force at that time was measured.

This peeling force corresponds to an adhesion force F (unit: N). The peeling force was measured according to the method for measuring a peeling force disclosed in comparative examples in paragraphs 0102 to 0107 of JP2011-206977A. That is, the measurement was performed peeling steps 1 to 6 and 16 to 18 of FIG. 5 in the above-described gazette.

A: F≥45 N
B: 45 N>F

<Wettability>

The wettability of the curable composition for imprinting with respect to the adhesive film was measured according to the following method.

The surface of a spun-on carbon (SOC) film formed on a silicon wafer was spin-coated with the above-described composition for forming an adhesive film which was then heated for 1 minute on a hot plate at 100° C. to dry the solvent.

For Examples 1 to 17, 19 to 25, and 34 to 43, and Comparative Examples 1 to 3, the composition for forming an adhesive film was hardened by further heating for 1 minute on a hot plate at 180° C. to form an adhesive film. The thickness of the adhesive film after hardening was 5 nm.

For Examples 28 to 33, the entire surface of the film was irradiated with ultraviolet rays using a high-pressure mercury lamp so that an exposure amount was 1,000 mJ/cm², and by heating on a hot plate at 180° C. for 1 minute, an adhesion film having a thickness of 5 nm was formed.

For Examples 26 and 27, an acidic aqueous solution of pH 1 was paddled, left stand for 30 seconds, and rinsed with pure water. Thereafter, after rotating a wafer for 30 seconds at 4000 rpm, by heating at 180° C. for 1 minute, an adhesive film having a thickness of 5 nm was formed.

A curable composition for imprinting V1 of which the temperature was adjusted to 25° C. was discharged on the surface of the adhesive film provided on the silicon wafer at an amount of liquid droplet of 1 µL per nozzle using an inkjet printer DMP-2831 manufactured by Fujifilm Dimatix, to coat the surface of the adhesive film so that liquid droplets are squarely arrayed at an interval of about 100 µm. A contact angle θ 5 seconds after liquid deposition was measured.

A: θ≤5°
B: 5°<θ≤8°
C: 8°<θ≤12°
D: 12°<θ

<Defects>

The defects of the obtained pattern were evaluated as follows.

The surface of a spun-on carbon (SOC) film formed on a silicon wafer was spin-coated with the above-described composition for forming an adhesive film which was then heated for 1 minute on a hot plate at 100° C. to dry the solvent.

For Examples 1 to 17, 19 to 25, and 34 to 43, and Comparative Examples 1 to 3, the composition for forming an adhesive film was hardened by further heating for 1 minute on a hot plate at 180° C. to form an adhesive film. The thickness of the adhesive film after hardening was 5 nm.

For Examples 28 to 33, the entire surface of the film was irradiated with ultraviolet rays using a high-pressure mercury lamp so that an exposure amount was 1,000 mJ/cm², and by heating on a hot plate at 180° C. for 1 minute, an adhesion film having a thickness of 5 nm was formed.

For Examples 26 and 27, an acidic aqueous solution of pH 1 was paddled, left stand for 30 seconds, and rinsed with pure water. Thereafter, after rotating a wafer for 30 seconds at 4000 rpm, by heating at 180° C. for 1 minute, an adhesive film having a thickness of 5 nm was formed.

A curable composition for imprinting V1 of which the temperature was adjusted to 25° C. was discharged on the surface of the adhesive film obtained above at an amount of liquid droplet of 1 pL per nozzle using an inkjet printer DMP-2831 manufactured by Fujifilm Dimatix, to coat the surface of the adhesive film so that liquid droplets are squarely arrayed at an interval of about 100 µm, and to make a pattern forming layer. Next, a quartz mold (rectangular line/space pattern (1/1), line width of 60 nm, groove depth of 100 nm, line edge roughness of 3.5 nm) was brought into press contact with the pattern forming layer, and the mold was filled with the pattern forming layer (curable composition for imprinting). A high pressure mercury lamp was used to perform an exposure from the mold side under the condition of 300 mJ/cm². Then, the mold was peeled off to transfer the pattern to the pattern forming layer.

The pattern transferred to the pattern forming layer was observed with an optical microscope STM6-LM manufactured by Olympus Corporation) to evaluate a peeling trouble of the pattern forming layer.

A: A peeling failure occurred in less than 1% of the total pattern area.

B: The peeling failure occurred in greater than or equal to 1% of the total pattern area.

<Gas Permeability>

Gas permeability of the adhesive film was evaluated as follows.

A silicon wafer and a quartz wafer were spin-coated with the above-described composition for forming an adhesive film which was then heated for 1 minute on a hot plate fat 100° C. to dry the solvent.

For Examples 1 to 17, 19 to 25, and 34 to 43, and Comparative Examples 1 to 3, the composition for forming an adhesive film was hardened by further heating for 1 minute on a hot plate at 180° C. to form an adhesive film. The thickness of the adhesive film after hardening was 5 nm.

For Examples 28 to 33, the entire surface of the film was irradiated with ultraviolet rays using a high-pressure mercury lamp so that an exposure amount was 1,000 mJ/cm², and by heating on a hot plate at 180° C. for 1 minute, an adhesion film having a thickness of 5 nm was formed.

For Examples 26 and 27, an acidic aqueous solution of pH 1 was paddled, left stand for 30 seconds, and rinsed with pure water. Thereafter, after rotating a wafer for 30 seconds at 4000 rpm, by heating at 180° C. for 1 minute, an adhesive film having a thickness of 5 nm was formed.

A curable composition for imprinting V1 of which the temperature was adjusted to 25° C. was discharged on the surface of the adhesive film provided on the silicon wafer at an amount of liquid droplet of 1 µL per nozzle using an inkjet printer DMP-2831 manufactured by Fujifilm Dimatix, to coat the surface of the adhesive film so that liquid droplets are squarely arrayed at an interval of about 100 µm.

Figure 2:
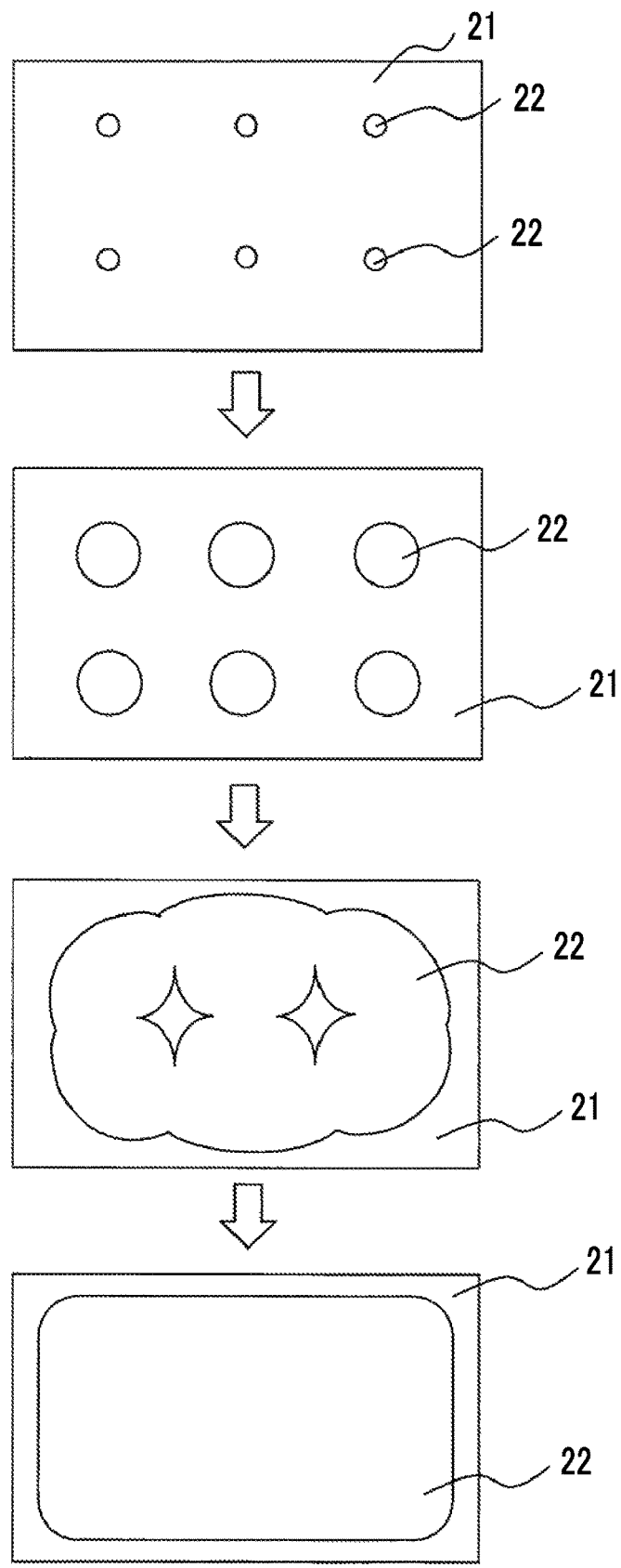
FIG. 2 is a schematic view showing a state of wet-spreading of a curable composition for imprinting in a case where a surface of an adhesive film having low wettability is coated with a curable composition for imprinting through an inkjet method.

The atmosphere was replaced with helium, and the adhesive film-forming side of the quartz wafer provided with the adhesive film was brought into contact with the curable composition for imprinting. By this operation, a gas region is surrounded by the curable composition for imprinting that was wet and spread as shown in FIG. 2. A time until helium escapes after passing through the adhesion layer and the quartz wafer, that is, a time until the gas region surrounded by the curable composition for imprinting between the silicon wafer and the quartz wafer is not visually recognized was measured.

A: Less than 1.5 seconds
B: 1.5 seconds or more

TABLE 6

| | Critical surface tension A | Critical surface tension B | Film surface condition | Change in film thickness | Adhesiveness of substrate and adhesive film | Wettability | Defects | Gas permeability |
|---|---|---|---|---|---|---|---|---|
| Example 1 | 30 | 45 | A | A | A | B | A | A |
| Example 2 | 30 | 46 | A | A | A | A | A | A |
| Example 3 | 30 | 47 | A | A | A | A | A | A |
| Example 4 | 22 | 45 | A | A | A | A | A | A |
| Example 5 | 30 | 45 | A | A | A | C | A | A |
| Example 6 | 30 | 46 | A | A | A | C | A | A |

TABLE 6-continued

| | Critical surface tension A | Critical surface tension B | Film surface condition | Change in film thickness | Adhesiveness of substrate and adhesive film | Wettability | Defects | Gas permeability |
|---|---|---|---|---|---|---|---|---|
| Example 7 | 30 | 48 | A | A | A | A | A | A |
| Example 8 | 24 | 45 | A | A | A | A | A | A |
| Example 9 | 30 | 45 | A | A | A | B | A | A |
| Example 10 | 29 | 48 | A | A | A | A | A | A |
| Example 11 | 30 | 45 | A | A | A | C | A | A |
| Example 12 | 30 | 45 | A | A | A | A | A | A |
| Example 13 | 30 | 45 | A | A | A | A | A | A |
| Example 14 | 30 | 45 | A | A | A | A | A | A |
| Example 15 | 30 | 45 | A | A | A | B | A | A |
| Example 16 | 29 | 47 | A | A | A | A | A | A |
| Example 17 | 26 | 49 | A | A | A | B | A | A |
| Comparative Example 3 | 29 | 47 | A | A | A | B | A | B |
| Example 19 | 24 | 46 | A | A | A | B | A | A |
| Example 20 | 29 | 46 | A | A | A | A | A | A |
| Example 21 | 29 | 46 | A | A | A | A | A | A |
| Example 22 | 24 | 46 | A | A | A | A | A | A |
| Example 23 | 30 | 45 | A | A | A | B | A | A |
| Example 24 | 30 | 48 | A | A | A | A | A | A |
| Example 25 | 30 | 48 | A | A | A | B | A | A |
| Example 26 | 30 | 47 | A | A | A | B | A | A |
| Example 27 | 30 | 45 | A | A | A | A | A | A |
| Example 28 | 30 | 45 | A | A | A | B | A | A |
| Example 29 | 29 | 45 | A | A | A | B | A | A |
| Example 30 | 29 | 49 | A | A | A | A | A | A |
| Example 31 | 29 | 45 | A | A | A | B | A | A |
| Example 32 | 29 | 45 | A | A | A | B | A | A |
| Example 33 | 29 | 46 | A | A | A | B | A | A |
| Example 34 | 29 | 45 | A | A | A | B | A | A |
| Example 35 | 29 | 45 | A | A | A | B | A | A |
| Comparative Example 1 | 43 | 43 | B | B | B | D | B | A |
| Comparative Example 2 | 40 | 40 | B | B | B | D | B | A |
| Example 36 | 33 | 45 | A | A | A | A | A | A |
| Example 37 | 31 | 44 | A | A | A | A | A | A |
| Example 38 | 25 | 42 | A | A | A | B | A | A |
| Example 39 | 30 | 43 | A | A | A | B | A | A |
| Example 40 | 30 | 43 | A | A | A | B | A | A |
| Example 41 | 30 | 42 | A | A | A | B | A | A |
| Example 42 | 29 | 45 | A | A | A | A | A | A |
| Example 43 | 30 | 42 | A | A | A | B | A | A |

As is clearly seen from the above results, in a case where the composition of the embodiment of the present invention is used, a film having favorable film surface conditions, a change in film thickness, adhesiveness to a substrate, wettability of the curable composition, and gas permeability was obtained, as compared to compositions that are outside the scope of the present invention. It has also been found that, in a case where an imprint pattern is formed on a film obtained using the composition of the embodiment of the present invention, a pattern with few defects is formed.

EXPLANATION OF REFERENCES

1: substrate
2: adhesive film
3: curable composition for imprinting
4: mold
21: adhesive film
22: curable composition for imprinting

What is claimed is:

1. A composition for forming an adhesive film for imprinting, comprising:
   at least one of the following compound 1 and the following compound group 2,
   the compound 1: a compound that has a polymerizable group and a polarity conversion group, and is a resin, in which the resin has the polarity conversion group in at least a main chain or a side chain, the polarity conversion group is bonded to the main chain of the resin via a linking group in a case where the polarity conversion group is provided in the side chain, and the number of atoms constituting a chain of the linking group is 8 or more, and
   the compound group 2: a compound that has a polymerizable group and does not have a polarity conversion group, and a compound that does not have a polymerizable group and has a polarity conversion group; and
   a solvent,
   wherein a content of the solvent in the composition is 80 mass % or more,
   the compound having a polymerizable group and a polarity conversion group, and the compound not having a polymerizable group and having a polarity conversion group each independently are a compound decomposable into two or more compounds in a case where the polarity conversion group is treated, and
   among the two or more compounds, at least one compound has a molecular weight of 30 to 400, and at least one compound has a molecular weight of 1,000 or more.

2. The composition according to claim 1, wherein the treatment is at least one of heating at 100° C. to 250° C., light irradiation, and chemical treatment.

3. The composition according to claim 1, wherein the compound having a molecular weight of 30 to 400 among the generated compounds is selected from alkene, ether, aldehyde, alcohol, carbon dioxide, sulfonic acid, and carboxylic acid.

4. The composition according to claim 1, comprising at least the compound 1.

5. The composition according to claim 4, comprising the compound that does not have a polymerizable group and has a polarity conversion group.

6. The composition according to claim 1, wherein the compound 1 is a (meth)acrylic resin.

7. The composition according to claim 1,
wherein at least one of repeating units having a polarity conversion group constituting the resin that is the compound 1 is a repeating unit derived from a monomer having the polarity conversion group, and
a C log P value of the monomer corresponding to a repeating unit obtained after subjecting the repeating unit having the polarity conversion group to the treatment is −10 to 0, provided that the C log P value is a coefficient showing affinity of an organic compound with respect to water and 1-octanol.

8. The composition according to claim 1, wherein the compound 1 further has an alkyleneoxy chain.

9. The composition according to claim 1, wherein a critical surface tension of a film formed of the component excluding the solvent from the composition is 35 mN/m or less, and a critical surface tension after the treatment of a film formed of the component excluding the solvent from the composition is 42 mN/m or more.

10. An adhesive film formed from the composition according to claim 1.

11. The adhesive film according to claim 10, wherein a critical surface tension is 42 mN/m or more.

12. A laminate comprising:
a substrate; and
an adhesive film positioned on a surface of the substrate, wherein the adhesive film is the adhesive film according to claim 10.

13. The laminate according to claim 12, further comprising a layer formed from a curable composition for imprinting on a surface of the adhesive film.

14. The laminate according to claim 12, further comprising a cured product pattern formed of a curable composition for imprinting on a surface of the adhesive film.

15. A method for producing a cured product pattern, the method comprising:
an adhesive film formation step of forming an adhesive film by applying the composition according to claim 1 onto a substrate;
an application step of applying a curable composition for imprinting onto a surface of the adhesive film;
a mold contact step of bringing the curable composition for imprinting into contact with a mold having a pattern for transferring a pattern shape;
a light irradiation step of irradiating the curable composition for imprinting with light to form a cured product; and
a release step of separating the cured product and the mold from each other.

16. A method for manufacturing a circuit substrate, the method comprising:
a step of obtaining a cured product pattern through the production method according to claim 15.

* * * * *